United States Patent [19]
Takahashi

[11] Patent Number: 5,295,001
[45] Date of Patent: Mar. 15, 1994

[54] IMAGE SENSING APPARATUS HAVING TONE CONTROL FUNCTION

[75] Inventor: Koji Takahashi, Yokohama, Japan

[73] Assignee: Canon Kabushiki Kaisha, Tokyo, Japan

[21] Appl. No.: 783,354

[22] Filed: Oct. 28, 1991

[30] Foreign Application Priority Data

| Nov. 1, 1990 | [JP] | Japan | 2-293668 |
| Nov. 1, 1990 | [JP] | Japan | 2-293669 |
| Nov. 1, 1990 | [JP] | Japan | 2-293670 |
| Nov. 1, 1990 | [JP] | Japan | 2-293671 |
| Nov. 1, 1990 | [JP] | Japan | 2-293672 |
| Nov. 1, 1990 | [JP] | Japan | 2-293673 |

[51] Int. Cl.$^5$ .............................................. H04N 1/04
[52] U.S. Cl. ................................... 358/482; 358/474; 358/483; 250/214 B; 348/230; 348/241
[58] Field of Search ............. 358/474, 482, 483, 446, 358/443, 213.11, 213.18, 213.19, 219, 221, 222; 250/200, 201.1, 214 AL, 214 B, 204, 206

[56] References Cited

U.S. PATENT DOCUMENTS

| 3,953,733 | 4/1976 | Levine | 250/330 |
| 4,479,062 | 10/1984 | Kawasaki et al. | 358/213.19 |
| 4,584,611 | 4/1986 | Katahira | 358/213 |
| 4,626,915 | 12/1986 | Takatsu | 358/213 |
| 4,635,126 | 1/1987 | Kinoshita | 358/213.19 |
| 4,701,626 | 10/1987 | Ishizaki et al. | 358/213.19 |
| 4,901,152 | 2/1990 | Hieda et al. | 358/209 |
| 5,182,658 | 1/1993 | Ishizaki et al. | 358/213.19 |

FOREIGN PATENT DOCUMENTS 61-274475 12/1986 Japan ............................. H04N5 335

Primary Examiner—Edward L. Coles, Sr.
Assistant Examiner—Jerome Grant, II
Attorney, Agent, or Firm—Fitzpatrick, Cella, Harper & Scinto

[57] ABSTRACT

An image sensing apparatus includes a sensing device for receiving a light signal, performing a photoelectric conversion and storing information, and a control device for changing the saturation level of the electric charge storable by the sensing device. The saturation level of the electric charge is changed by the control device so as to be comparatively small in an earlier part of a unit-light storage interval which forms one picture, and larger in a latter part of the interval.

12 Claims, 32 Drawing Sheets

(EXAMPLE OF COLOR-FILTER ARRAY)

BLC-OFF

EXAMPLE OF CORRECTION ACCORDING TO EMBODIMENT

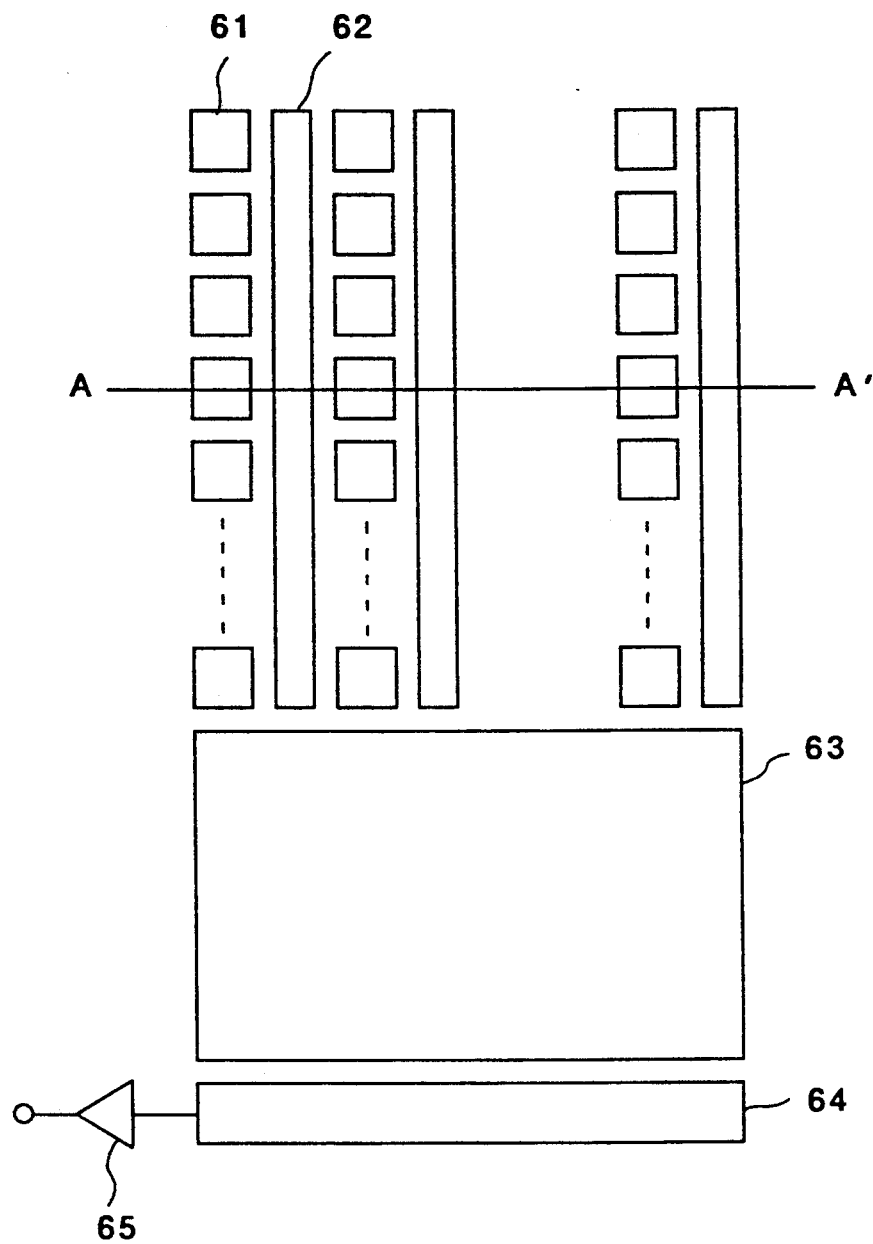
F I G. 8

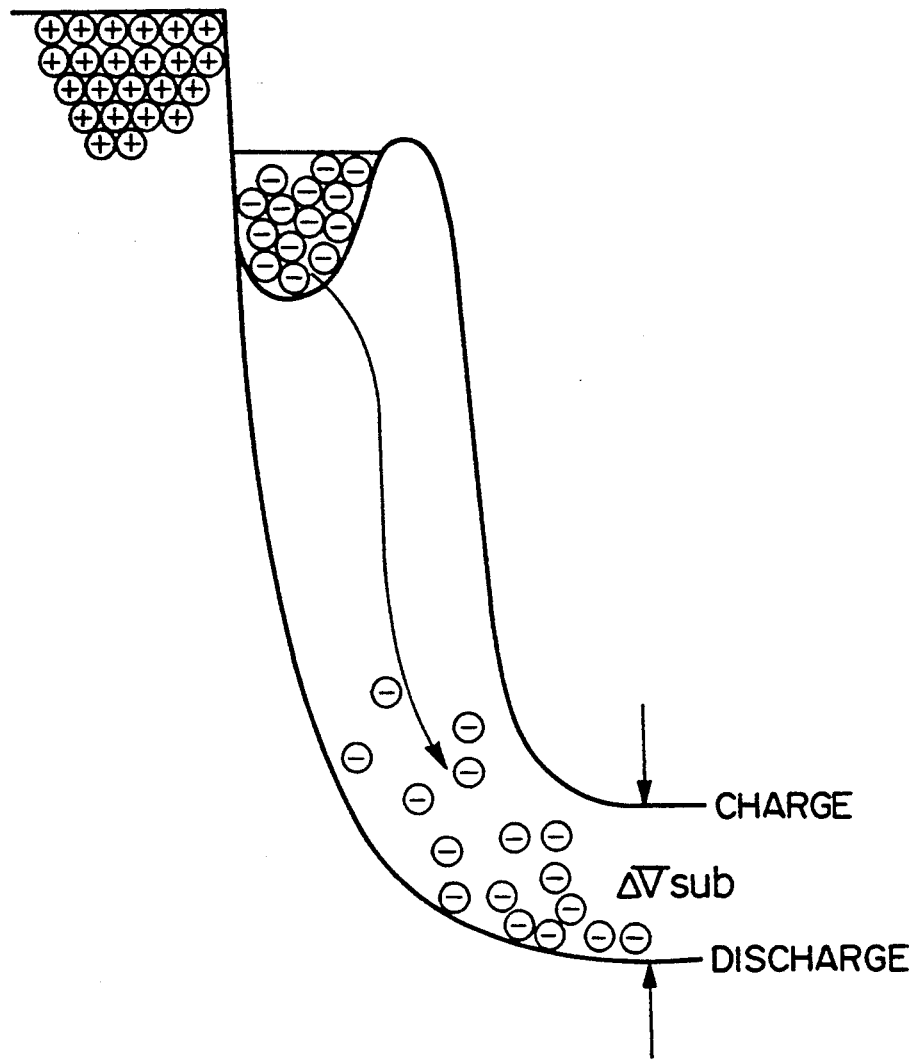
F I G. 10

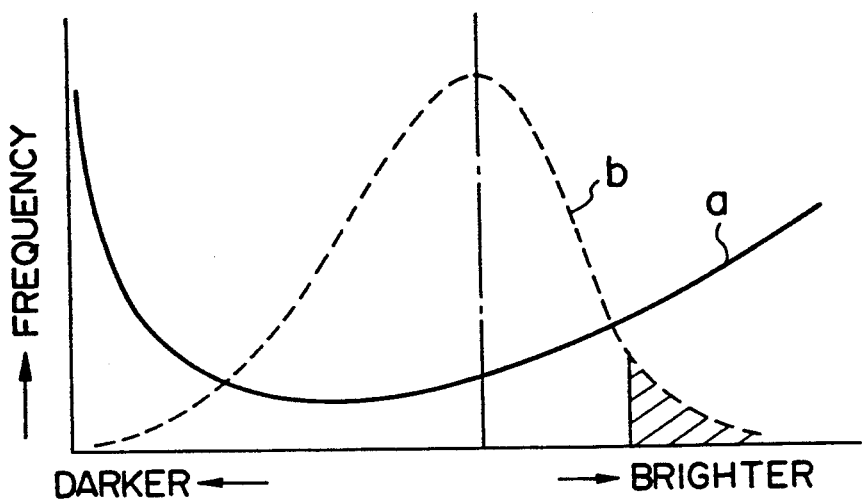
F I G. 16(a)
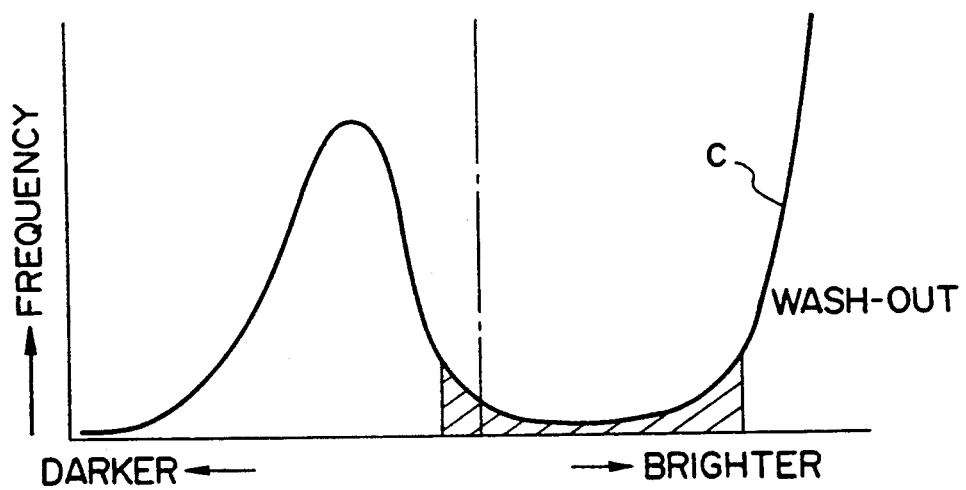
F I G. 16(b)

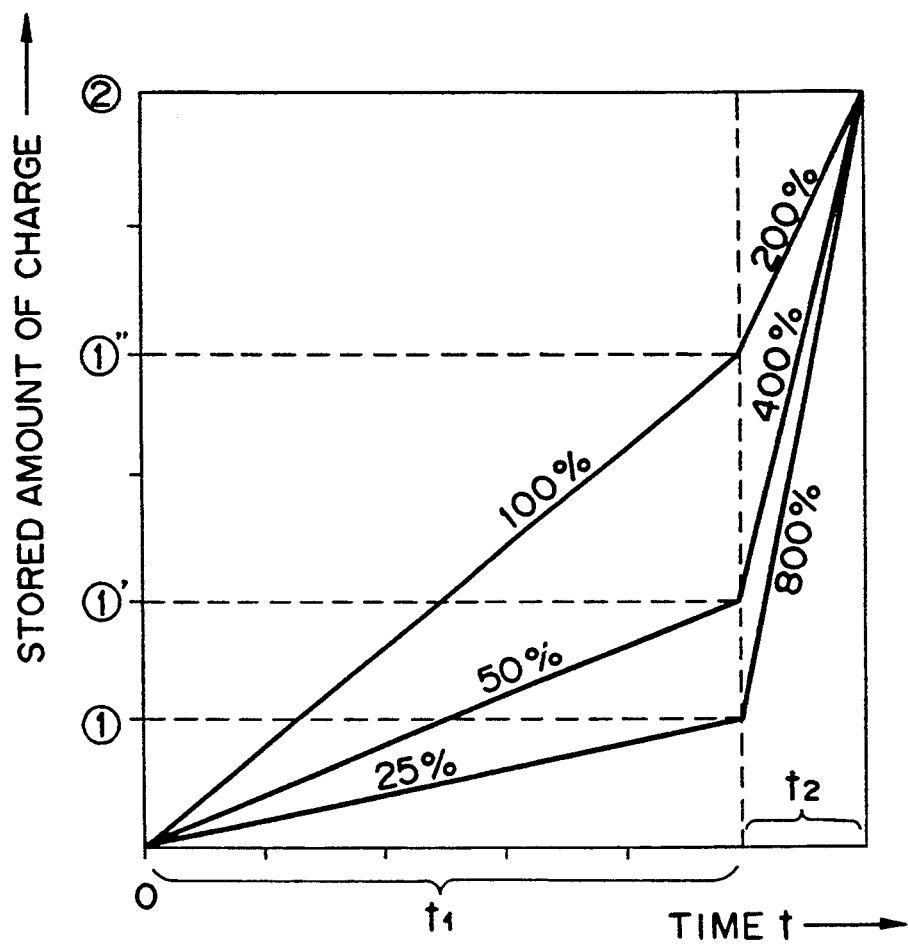
F I G. 17

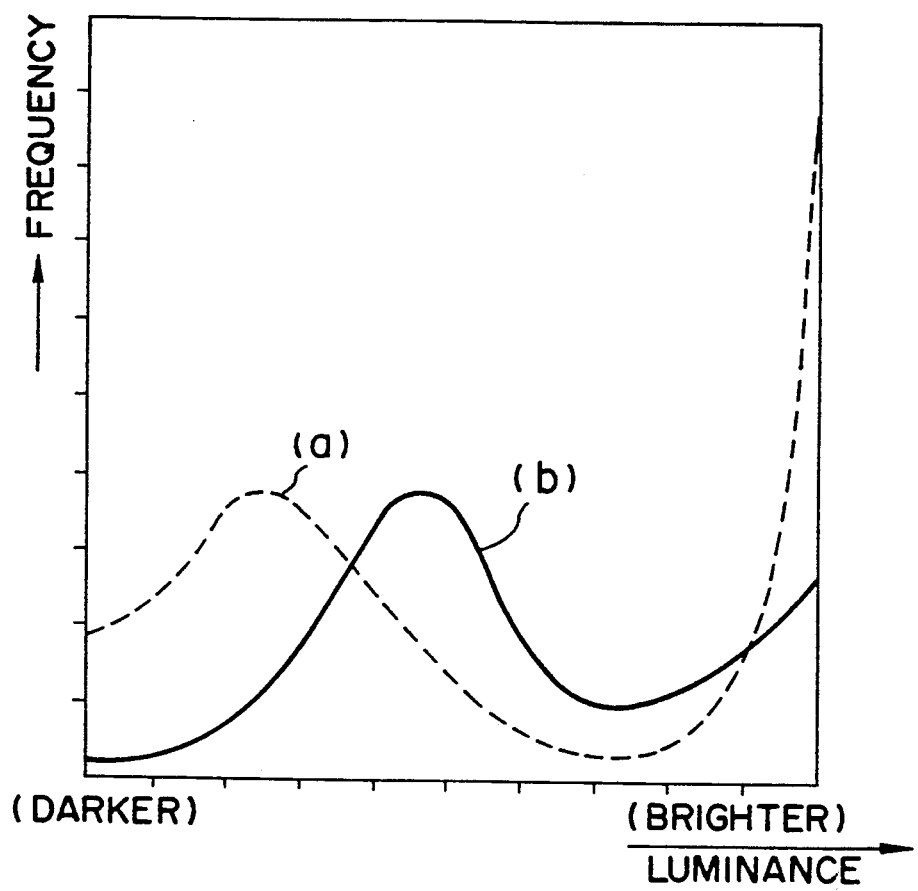
F I G. 19(a)

(EXAMPLE OF COLOR-FILTER ARRAY)

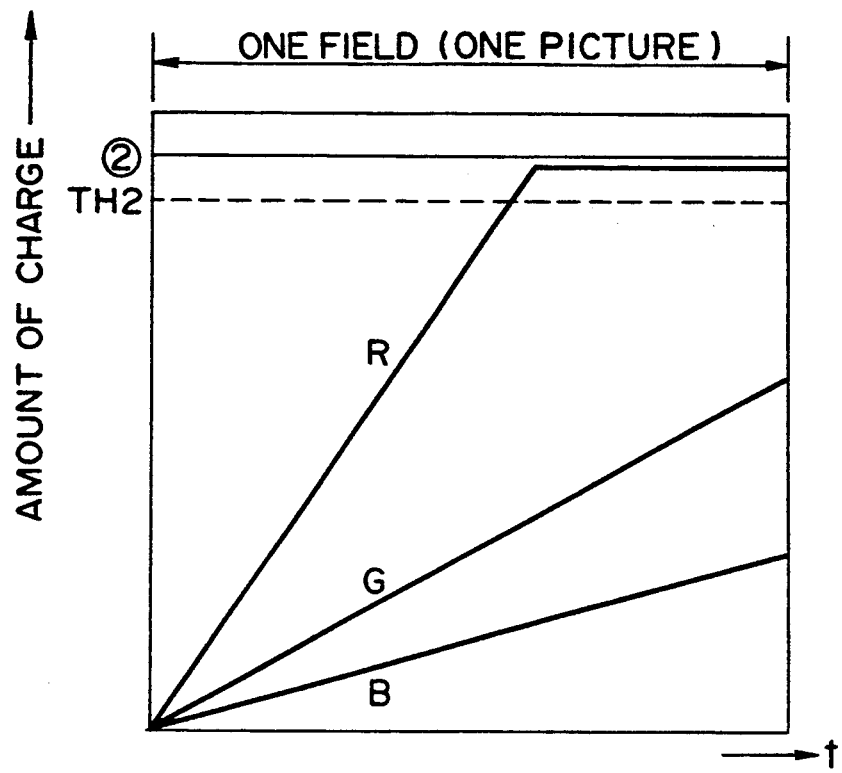
F I G. 21(a)
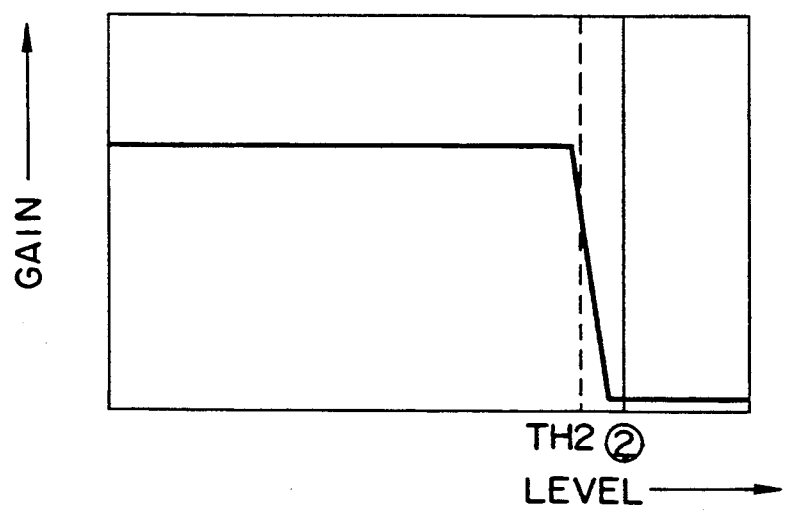
F I G. 21(b)

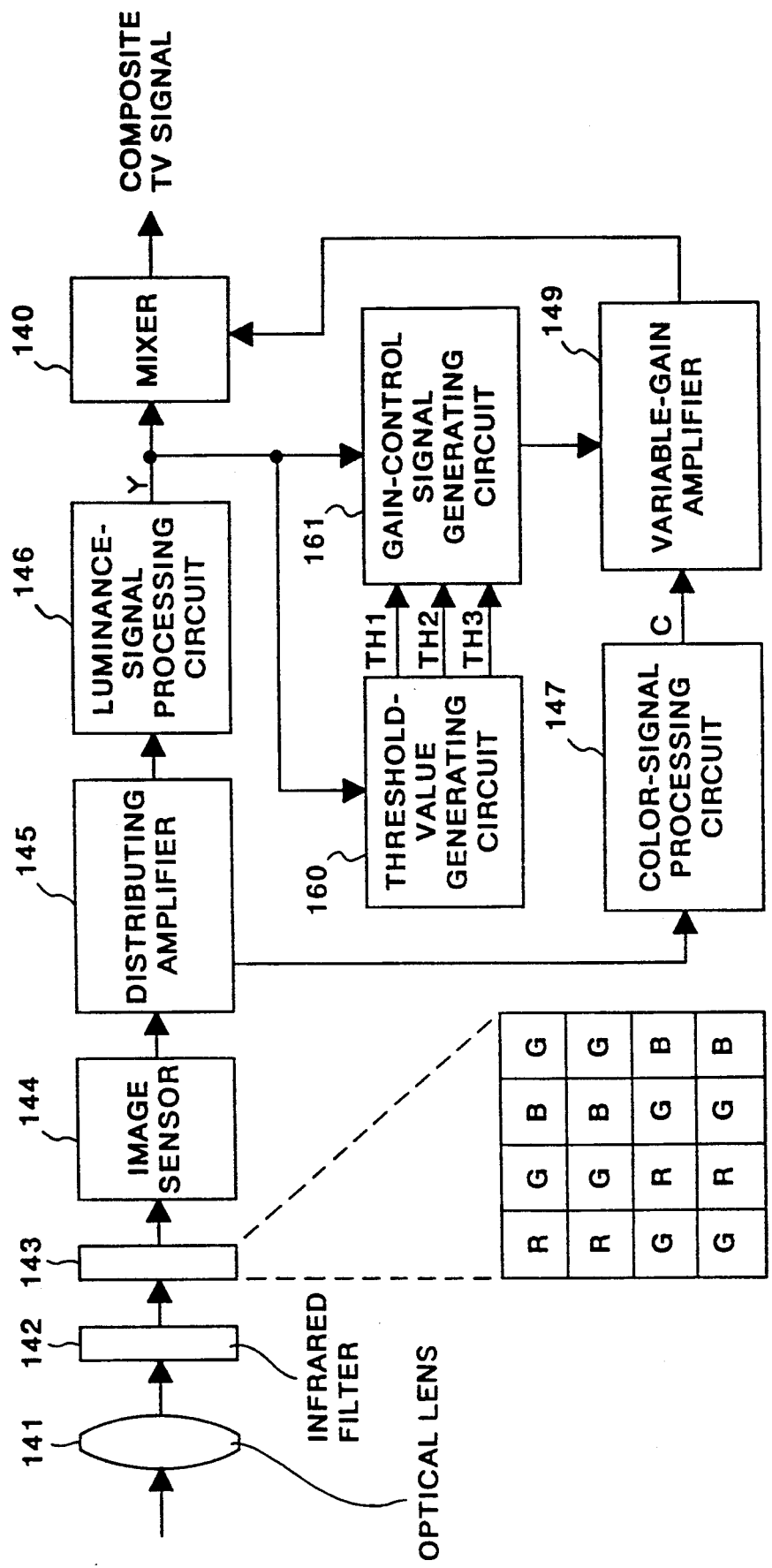
F I G. 22

| 1 | 2 | 3 | 4 | 5 | 6 |
|---|---|---|---|---|---|
| 7 | 8 | 9 | 10 | 11 | 12 |
| 13 | 14 | 15 | 16 | 17 | 18 |
| 19 | 20 | 21 | 22 | 23 | 24 |
| 25 | 26 | 27 | 28 | 29 | 30 |
| 31 | 32 | 33 | 34 | 35 | 36 |

EXAMPLE OF AREA APPLICATION

FIG. 24

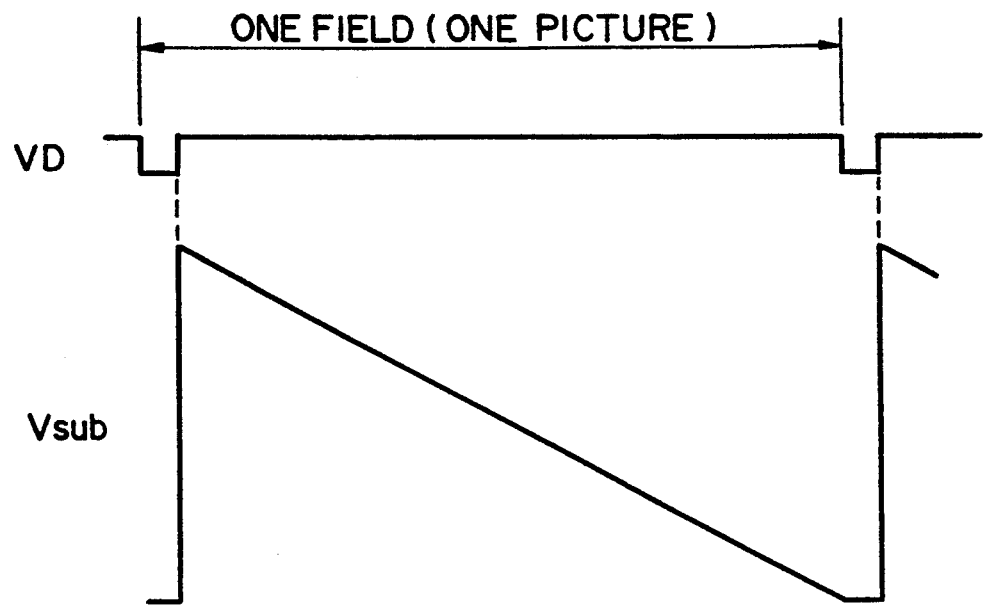
F I G. 29(a)
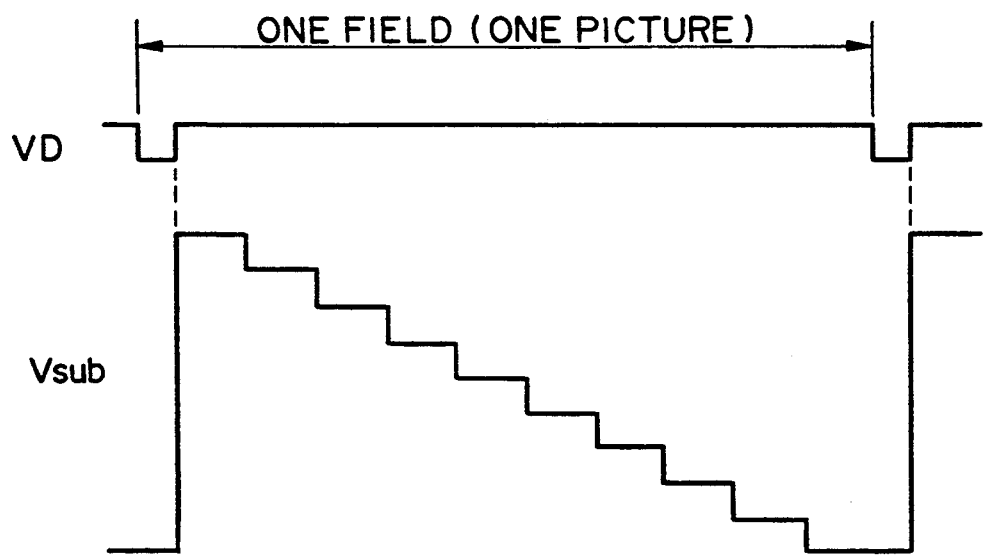
F I G. 29(b)

IMAGE SENSING APPARATUS HAVING TONE CONTROL FUNCTION

BACKGROUND OF THE INVENTION

This invention relates to an image sensing apparatus for photographing a subject, by way of example, more particularly, to an image sensing apparatus having a tone control function preferrable for use in compensating for backlighting or the like.

When photographing a subject using a video camera or the like in a backlighted situation where illumination is intense, the tones contained in one picture (or frame) cover a wide range.

Since an image sensing apparatus using a solid-state image sensor as employed in a video camera or the like does not have enough dynamic range for converting all of these tones into video signals, clipping occurs above and below the brightness level. This is a phenomenon in which the subjects appears too bright and devoid of color or too dark, even black. Specifically, the tones of extremely bright portions and extremely dark portions cannot be expressed in one picture.

In the case of backlighted photography, the main subject becomes shadowed and appears very dark in comparison with the brightness of the background, and blackening of the subject occurs.

A conventional countermeasure to prevent the foregoing is to use a technique, referred to as backlighting control (BLC), through which a backlighting correction is performed by increasing the amount of exposure. A backlighting correction based upon this conventional technique will be described in detail with reference to the drawings.

First, the operation of BLC in an exposure adjusting mechanism using an iris will be described with reference to FIG. 1, which is a block diagram illustrating the construction of a backlighting correction circuit.

As shown in FIG. 1, light rays from a subject enter via an optical lens 10, the amount of light is limited by an iris 11, and an image is formed on an image sensor 12. A signal resulting from a photoelectric conversion and conforming to the state of the formed image is outputted by the image sensor 12 and converted into a video signal by a signal processing circuit 13, which delivers the video signal as an output.

The video signal is supplied also to an AE circuit 14, which generates an iris control signal conforming to the video signal. Upon receiving the iris control signal from the AE circuit 14 via an adder 15, a driver 16 generates a drive signal which drives an ig meter 17, whereby automatic adjustment of the amount of light by the iris is realized.

In the above-described approach for automatically adjusting the amount of light, the common practice is to make the adjustment in dependence upon the integrated value of the video-signal luminance level in one picture, and therefore emphasis is placed solely upon the average brightness of the entirety of one picture. As a consequence, in the case of backlighted photography, the adjustment of the amount of light incident upon the image sensor is carried out in dependence upon the background, which is extremely bright. The result is that the main subject becomes too dark, as a result of which the blackening phenomenon occurs.

In such a case, it is necessary for the photographer to issue a backlighting correction command to turn on the BLC function In the arrangement of FIG. 1, a BLC switch 19 is turned on (closed), whereby a correction signal generating circuit 18 supplies the driver 16 with a signal for widening the opening of the diaphragm. This signal arrives via the adder 15. As a result, the driver 16 drives the ig meter 17 in the opening direction to increase the amount of light incident upon the image sensor 12, whereby the backlighting correction is achieved.

By thus closing the BLC switch 19 to carry out the backlighting correction through this conventional technique, the image is changed from the BLC-OFF state (the state prior to the backlighting correction), shown in FIG. 2(a), to the BLC-ON state (the state after the backlighting correction), shown in FIG. 2(b). As will be appreciated from FIGS. 2(a) and (b), the background shows up well in the BLC-OFF state, but the subject is darkened and does not show up very well. By contrast, the tones of the subject are expressed and appear excellently in the BLC-ON state.

However, in the conventional image sensing apparatus described above, performing the backlighting correction increases the amount of light received by the image sensor, thereby causing the main subject to show up well, but the background appears washed out and cannot be made to appear. This may be understood from FIG. 2(b).

In other words, with the backlighting correction by the conventional technique, clipping occurs at a high or low level owing to the limitation upon the dynamic range of the image sensor, so that it is not possible to pick up the images of both the main subject and background well.

SUMMARY OF THE INVENTION

Accordingly, an object of the present invention is to provide an image sensing apparatus having a tone control function in which it is possible to realize excellent exposure of both the main subject and background.

Another object of the present invention is to provide an image sensing apparatus having a tone control function capable of expressing tones over a wide apparent range.

Still another object of the present invention is to provide an image sensing apparatus having a tone control function capable of suppressing the occurrence of false color signals.

A further object of the present invention is to provide an image sensing apparatus having a tone control function in which exposure control can be carried out based upon light information indicative of individual areas in a frame.

Yet another object of the present invention is to provide an image sensing apparatus having a tone control function in which the state of an imaged picture can be varied by intentionally changing the opening of an iris.

According to the present invention, the foregoing objects are attained by providing an image sensing apparatus having a tone-control function and including sensing means for receiving a light signal, performing a photoelectric conversion and storing information, and control means for changing an amount (or saturation level) of the electric charge storable by the sensing means, wherein the storable amount of electric charge is changed by the control means during a unit light-storage interval that is for forming one picture.

By virtue of the foregoing arrangement, the image sensing apparatus having the tone control function of the present invention performs both an operation in which an exposure suited to a subject having little luminance is performed by setting the storable amount of the electric charge to be small during a unit light-storage interval, and an operation in which an exposure suited to a subject having a high luminance is performed by setting the storable amount of the electric charge to be large during the unit light-storage interval, these operations being combined to achieve excellent exposure for both a subject with little luminance and a subject with high luminance in one picture.

In a second aspect of the present invention, there is provided an image sensing apparatus having a tone-control function an including sensing means for receiving a light signal, performing a photoelectric conversion and storing information, and control means for changing an amount of the electric charge storable by the sensing means, wherein, during a unit light-storage interval that is for forming one picture, the control means performs control so as to change the storable amount of the electric charge in a plurality of steps and sets, in dependence upon image information, the timing at which the storable amount of the electric charge is changed in the plurality of steps.

By virtue of the foregoing arrangement, the image sensing apparatus having the tone control function of the present invention performs both an operation in which an exposure suited to a subject having little luminance is performed by setting the storable amount of the electric charge to be small during a unit light-storage interval, and an operation in which an exposure suited to a subject having a high luminance is performed by setting the storable amount of the electric charge to be large during the unit light-storage interval, the timing at which these operations are changed over being set in dependence upon the image information to achieve excellent exposure for both a subject with little luminance and a subject with high luminance in one picture.

In a third aspect of the present invention, there is provided an image sensing apparatus having a tone-control function and including sensing means for receiving a light signal, performing a photoelectric conversion and storing information, and control means for changing an amount of the electric charge storable by the sensing means, wherein, during a unit light-storage interval that is for forming one picture, the control means performs control so as to change the storable amount of the electric charge in a plurality of steps and sets, in dependence upon image information, the levels of the plurality of steps.

By virtue of the foregoing arrangement, the image sensing apparatus having the tone control function of the present invention performs both an operation in which an exposure suited to a subject having little luminance is performed by setting the storable amount of the electric charge to be small during a unit light-storage interval, and an operation in which an exposure suited to a subject having a high luminance is performed by setting the storable amount of the electric charge to be large during the unit light-storage interval, the level of the storable amount of the electric charge in each of these operations being set in dependence upon the image information to achieve excellent exposure for both a subject with little luminance and a subject with high luminance in one picture.

In a fourth aspect of the present invention, there is provided an image sensing apparatus having a tone-control function and including sensing means for receiving a light signal, performing a photoelectric conversion and storing information, and control means for changing an amount of the electric charge storable by the sensing means, wherein, during a unit light-storage interval that is for forming one picture, the control means performs control so as to change the storable amount of the electric charge, the mu-factor of a color signal being changed in association with the change in the storable amount of the electric charge.

By virtue of the foregoing arrangement, the image sensing apparatus having the tone control function of the present invention is such that when a high-luminance color signal overflows by exceeding the storable amount of the electric charge (which overflow accompanies a change in the storable amount of the electric charge), the mu-factor of the color signal is reduced to prevent the occurrence of a false color signal.

In a fifth aspect of the present invention, there is provided an image sensing apparatus having a tone-control function and including sensing means for receiving a light signal, performing a photoelectric conversion and storing information, and control means for changing an amount of the electric charge storable by the sensing means, wherein, during a unit light-storage interval that is for forming one picture, the control means performs control so as to change the storable amount of the electric charge in a plurality of steps and sets, for each of the plurality of steps, and on the basis of image information indicative of individual areas in the one picture, the levels of the plurality of steps as well as the timing at which the storable amount of the electric charge is changed in the plurality of steps.

By virtue of the foregoing arrangement, the image sensing apparatus having the tone control function of the present invention performs both an operation in which an exposure suited to a subject having little luminance is performed by setting the storable amount of the electric charge to be small during a unit light-storage interval, and an operation in which an exposure suited to a subject having a high luminance is performed by setting the storable amount of the electric charge to be large during the unit light-storage interval. For the exposure operation applied to a low-luminance subject, exposure is controlled based upon image information indicative of the low-luminance portion of the subject. For the exposure operation applied to a high-luminance subject, exposure is controlled based upon image information indicative of the high-luminance portion of the subject. As a result, excellent exposure for both a subject with little luminance and a subject with high luminance is achieved.

In a sixth aspect of the present invention, there is provided an image sensing apparatus having a tone-control function and including sensing means for receiving a light signal, performing a photoelectric conversion and storing information, and control means for changing an amount of the electric charge storable by the sensing means, wherein, during a unit light-storage interval that is for forming one picture, the control means performs control so as to change the storable amount of the electric charge in a plurality of steps and perform storage of the electrical charge for prescribed times in distributed fashion in the plurality of steps, thereby controlling substantial exposure time in the plurality of steps.

By virtue of the foregoing arrangement, the image sensing apparatus having the tone control function of the present invention performs both an operation in which an exposure suited to a subject having little luminance is performed by setting the storable amount of the electric charge to be small during a unit light-storage interval, and an operation in which an exposure suited to a subject having a high luminance is performed by setting the storable amount of the electric charge to be large during the unit light-storage interval, these operations being combined to achieve excellent exposure for both a subject with little luminance and a subject with high luminance in one picture. In each operating interval, the storage of charge for the prescribed time is performed in distributed or dispersed fashion, and substantial exposure time in each operating interval is controlled, thereby making it possible to freely set the iris opening and provide a representation of video over a wide range.

Other objects and advantages besides those discussed above shall be apparent to those of skill in the art from the description of a preferred embodiment of the invention which follows. In the description, reference is made to the accompanying drawings, which form a part thereof, and which illustrate an example of the invention. Such an example, however, is not exhaustive of the various embodiments of the invention, and therefore reference is made to the claims which follow the description for determining the scope of the invention.

BRIEF DESCRIPTION OF THE DRAWINGS

FIG. 8 is a plan view schematically illustrating the structure of a frame interline transfer-type CCD;

FIG. 10 is a diagram illustrating the elimination of unnecessary charge in the direction of a substrate of a VOD-type CCD;

FIGS. 16(a) and 16(b) are diagrams showing a luminance histogram;

FIG. 17 is a diagram showing the relationship between storage time and the amount of stored electric charge;

FIGS. 19(a) and 19(b) are diagrams showing an example of histogram analysis of a video signal;

FIGS. 21(a) and 21(b) are diagrams showing the saturated state of a color signal;

FIG. 22 is a block diagram showing the construction solely of the portion of a color video camera that deals with color signals;

FIG. 24 is a diagram showing an example in which a frame is divided into a plurality of areas;

FIG. 29(a) and 29(b) are timing charts showing a modification for controlling potential level.

DESCRIPTION OF THE PREFERRED EMBODIMENT

A preferred embodiment of the present invention will now be described in detail with reference to the drawings.

Figure 1:
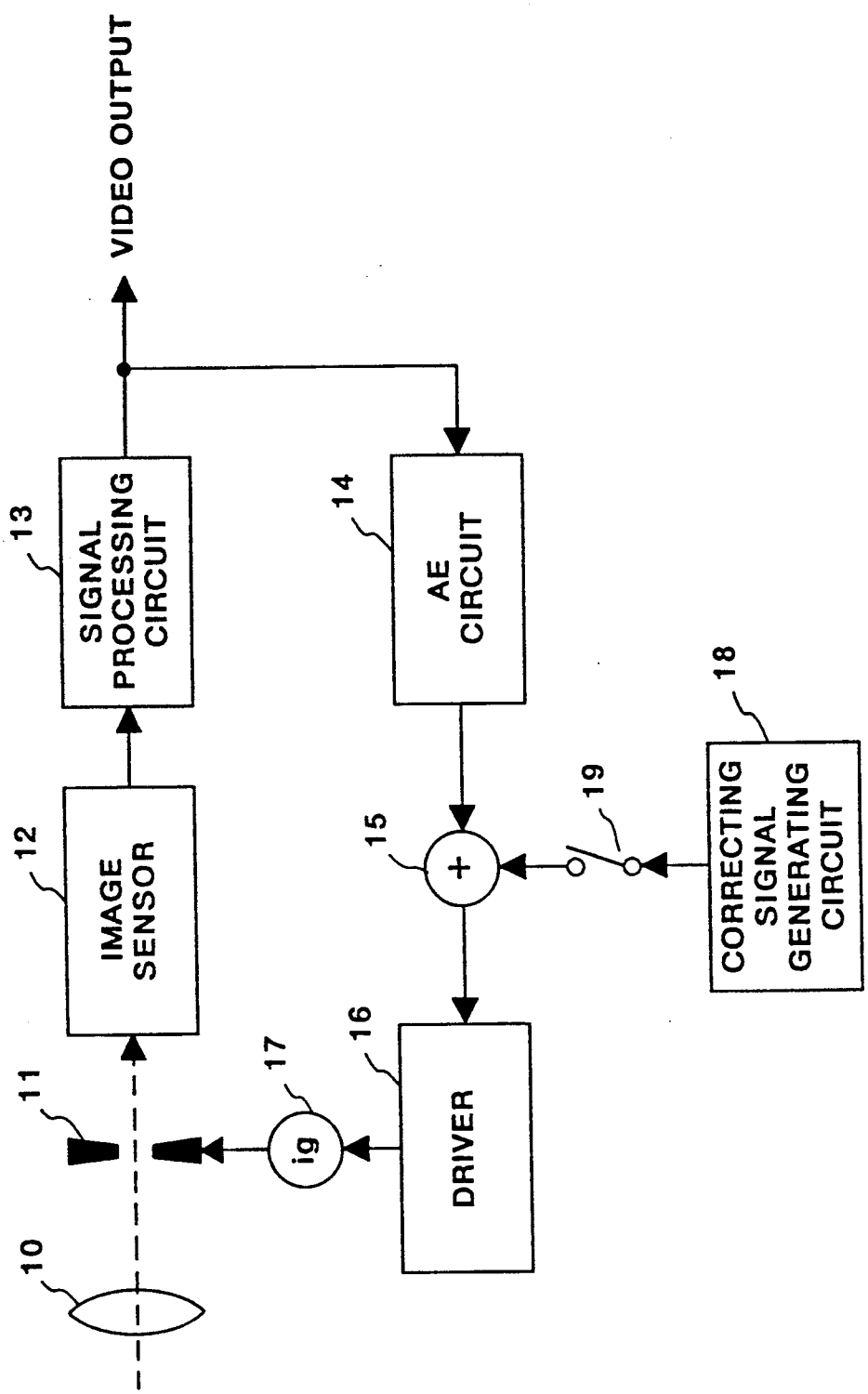
FIG. 1 is a block diagram illustrating the construction of a conventional backlighting correction circuit.
Figure 3:
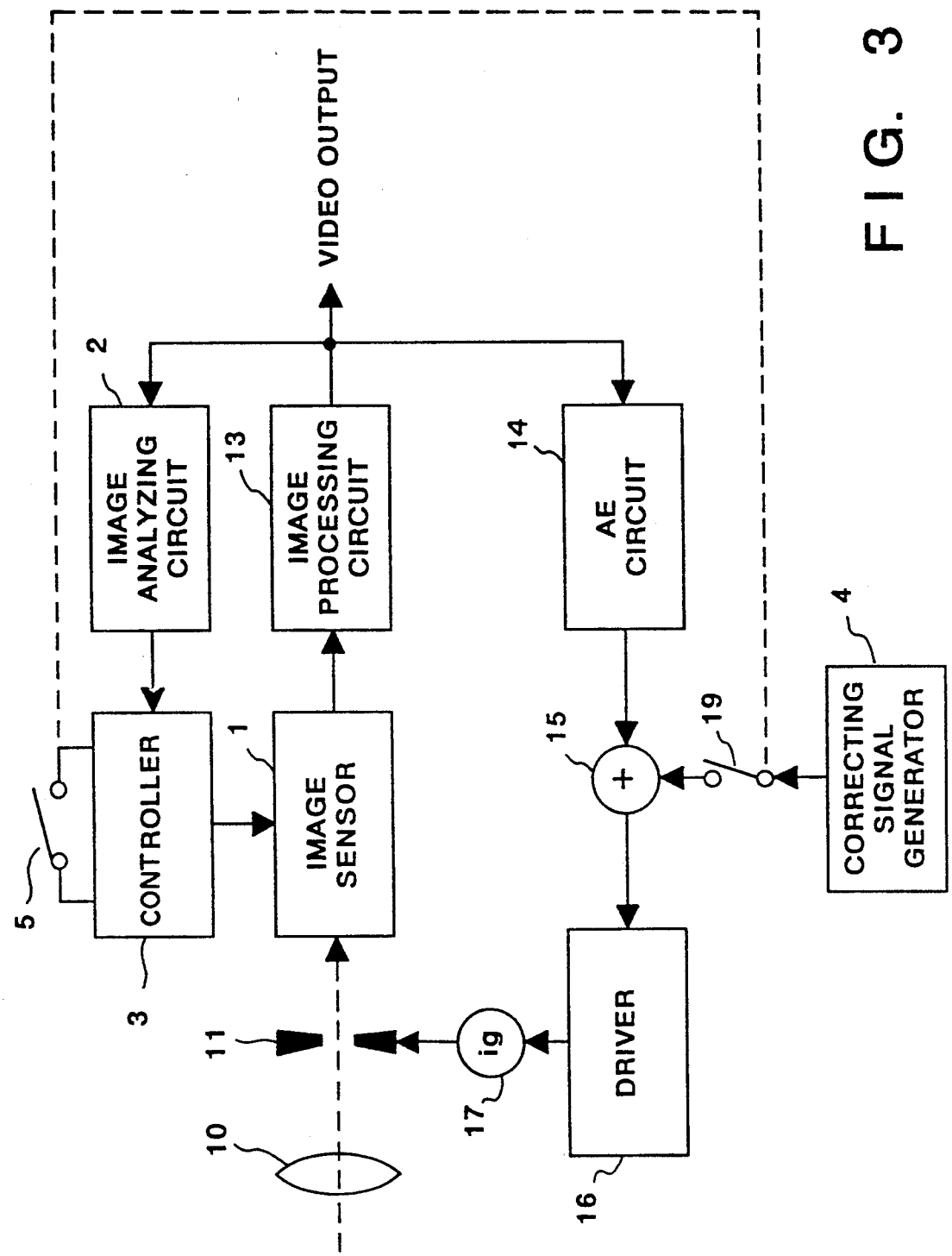
FIG. 3 is a block diagram illustrating the construction of an embodiment.

FIG. 3 is a block diagram illustrating the construction of an embodiment of an image sensing apparatus according to the present invention. The lower half of FIG. 3 is identical with the conventional circuit arrangement shown in FIG. 1. The concept of this embodiment will now be described based upon FIG. 3.

As shown in FIG. 3, light rays from the subject enter via the optical lens 10, the amount of light is adjusted by the iris 11, and an image is formed on an image sensor 1. An signal resulting from a photoelectric conversion by the image sensor 1 is converted into a video signal by the signal processing circuit 13. This signal is delivered as an output video signal and is supplied also to the AE circuit 14 and an image analyzing circuit 2.

The image analyzing circuit 2 performs analysis of luminance information possessed by the video signal and supplies a controller 3 with a luminance histogram, etc. By changing over a mode changeover switch 5 in dependence of the condition of the subject, either a normal mode (ordinary exposure mode) or BLC-ON mode (backlighting correction mode) is selected as the photographic mode. Upon receiving a photographic mode selecting signal from the mode changeover switch 5 and information such as a luminance histogram from the image analyzing circuit 2, the controller 3 controls the drive of the image sensor 1 in dependence upon this information.

Meanwhile, the AE circuit 14 generates an iris control signal in dependence upon the video signal, and applies this signal to the driver 16 via the adder 15. Upon receiving the iris control signal, the driver 16 generates a drive signal for driving the ig meter 17, thereby performing an automatic adjustment of the amount of light by the iris.

A correction signal used in a state such as the backlighted state is generated by a correction signal generating circuit 4. The BLC switch 19 is interlocked with the mode changeover switch 5. When the subject is backlighted, namely when the BLC-ON mode (the backlighting correction mode) has been selected by the mode changeover switch 5, the BLC switch 19 is turned on, i.e., closed. As a result, the correction signal from the correction signal generating circuit 4 is applied to the adder 15, just as in the case of conventional backlighting correction, thereby shifting the output of the AE circuit 14 in a direction which widens the opening of the iris 11.

Figure 4A:
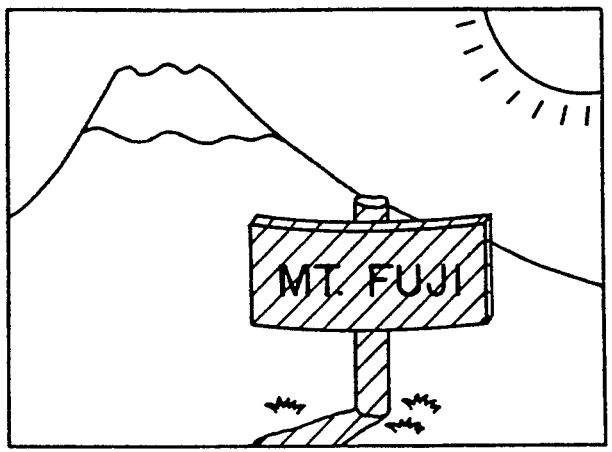
FIGS. 4(a) and 4(b) are diagrams showing an example of imaging in the backlighted state.
Figure 4B:
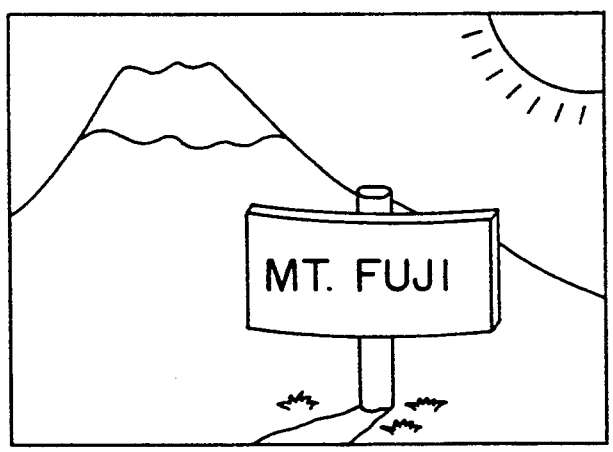

Accordingly, the present embodiment is such that when a backlighted state prevails, iris control similar to that in conventional backlighting correction is carried out to increase the amount of light incident upon the image sensor 1, under which conditions (namely with the BLC switch 19 is closed) a prescribed degree of driving control is applied to the image sensor 1 by the controller 3 in an effort to obtain an excellent state of exposure for both the main subject and background, as illustrated in FIG. 4(b).

In the BLC-OFF state, the darkening phenomenon shown in FIG. 4(a) occurs just as in the case of BLC-OFF described in the prior art.

The image sensor 1 controlled by the controller 3 will now be described.

Image sensors are of a large number of types, such as of the CCD-, MOS- and BASIS-type, depending upon the principle of photoelectric conversion adopted. A CCD, which is used most commonly in video cameras at the present time, will be discussed as one example. CCDs are classified according to the structure of the semiconductor device, namely according to the type of charge reading system, such as FT (frame transfer) or FIT (frame interline transfer), and the type of processing for unnecessary charges, such as the processing in a VOD-type CCD, where VOD is the abbreviation of vertical overflow drain.

The operation of a high-speed shutter, which is one type of basic operation of a CCD, will be described in concurrence with the description of the basic structure of an interline transfer-type (IT-type) CCD.

Figure 2A:
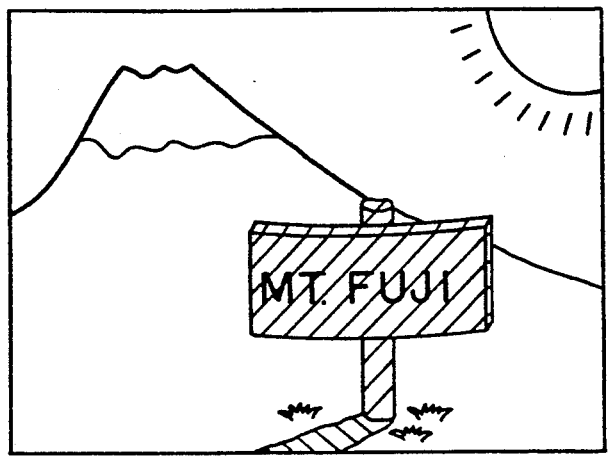
FIGS. 2(a) and 2(b) are diagrams showing the effects of the conventional backlighting correction.
Figure 2B:
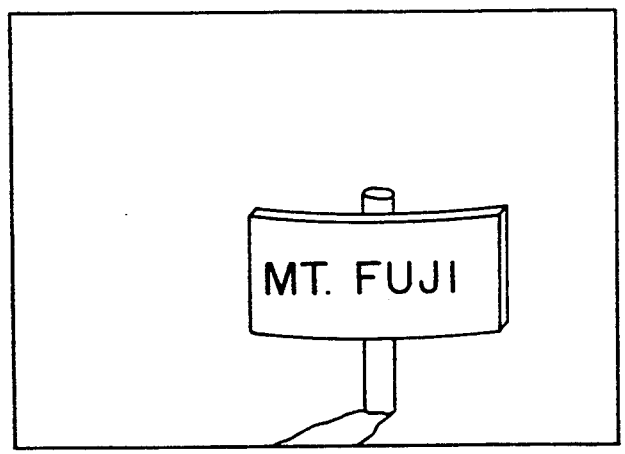
Figure 5:
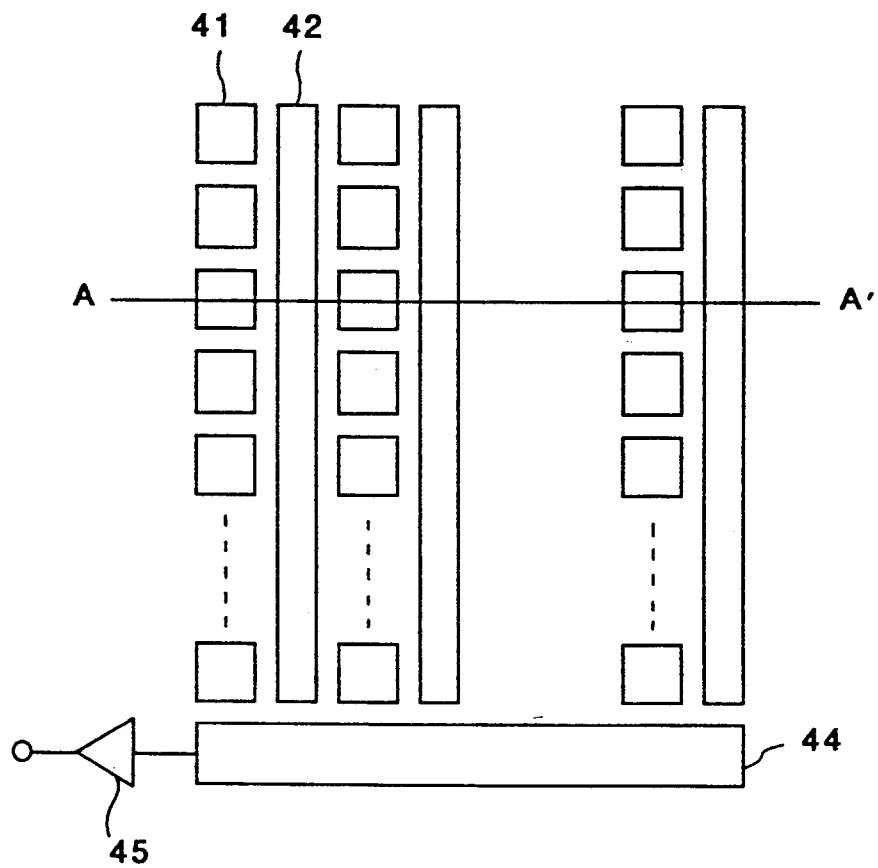
FIG. 5 is a plan view schematically illustrating the structure of an interline transfer-type CCD.
Figure 6:
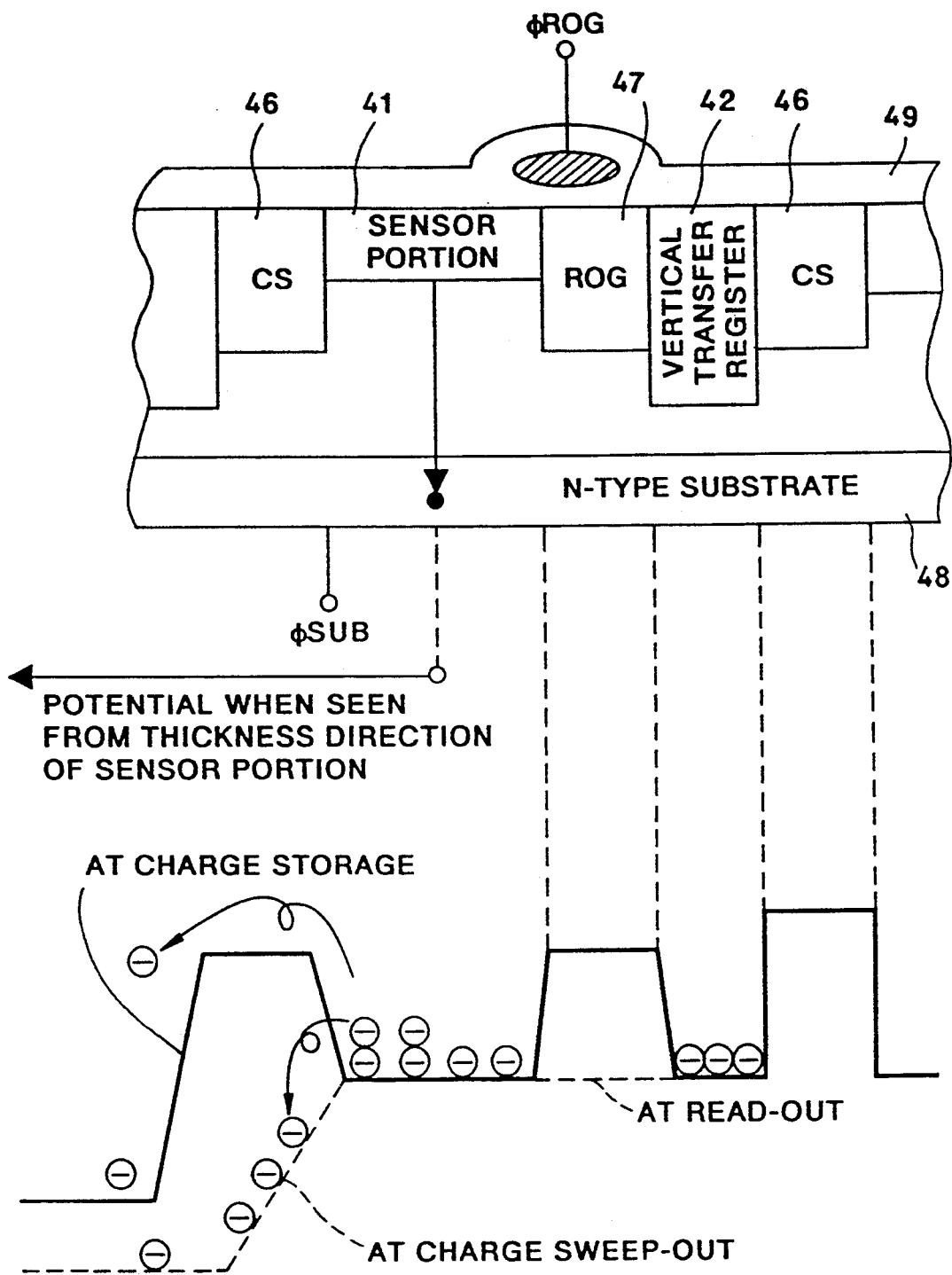
FIG. 6 is a sectional view schematically illustrating the structure of an interline transfer-type CCD.

FIG. 5 is a plan view schematically illustrating the structure of an interline transfer-type (IT-type) CCD. Numeral 41 denotes a sensor portion (sensing means) which performs a photoelectric conversion, 42 a vertical transfer register, 44 a horizontal transfer register, and 45 an output amplifier. FIG. 6 is a sectional view taken along line A—A' of FIG. 2 and a diagram illustrating the states of potentials at various portions corresponding to this cross section.

In FIG. 6, numeral 46 denotes a channel stop (CS) for pixel separation, 47 a read-out gate (ROG) for transferring the electric charge, which has accumulated in the sensor portion 41, to the vertical transfer register 42, 48 a substrate, and 49 an oxide film The operation of the high-speed shutter will now be described with reference to FIGS. 5 through 7.

Figure 7:
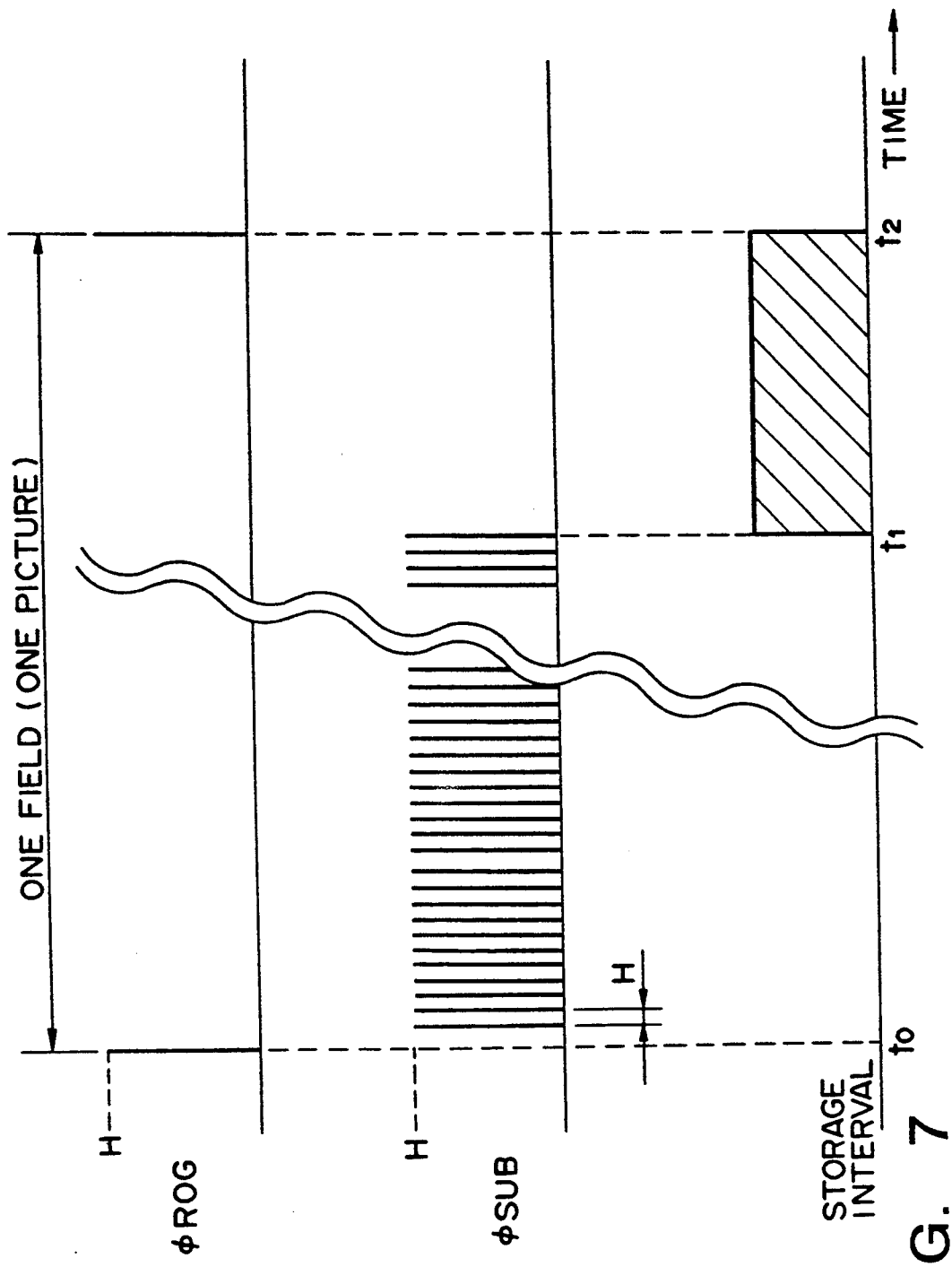
FIG. 7 is a timing chart illustrating the operation of a high-speed shutter.

FIG. 7 is a timing chart of signals in one field interval (e.g., about 1/60 sec according to the NTSC standard) of a standard television signal. A $\phi$ROG pulse is a pulse applied to the read-out gate (ROG) 47. When the logic level of this pulse is "H", the potential of the read-out gate 47 falls and the electric charge in the sensor portion 41 is transferred to the vertical transfer register 42. An elimination pulse $\phi$SUB is a pulse applied to the substrate 48. When this pulse is "H", the electric charge which has accumulated in the sensor portion 41 is swept out (eliminated) to the exterior through a $\phi$SUB terminal.

In this example, as shown in FIG. 7, the $\phi$ROG pulse is applied during the vertical retrace interval, and the $\phi$SUB pulse is applied during the horizontal retrace interval or in the proximity of the horizontal retrace interval. After the electric charge of the sensor portion 41 is read out at time $t_0$, the next field interval begins. However, since $\phi$SUB attains the "H" level in the horizontal retrace interval at time $t_1$, the electric charge which has accumulated from $t_0$ to $t_1$ does not remain in the sensor portion 41. Since $\phi$SUB is at the "L" level from time $t_1$ to time $t_2$, electric charge is stored in the sensor portion 41 during this time period. This charge is transferred to the vertical transfer register 2 by the "H"-level $\phi$ROG pulse applied at time $t_2$. The end result is that the exposure time in this case becomes $(t_2-t_1)$.

The high-speed shutter operation of the IT-type CCD is thus realized.

The operation of a frame interline transfer-type (FIT-type) CCD will now be described.

FIG. 8 is a plan view schematically showing the structure of a frame interline transfer-type (FIT-type) CCD. This CCD differs from the interline transfer-type (IT-type) CCD shown in FIG. 5 in that a memory 63 is provided. The number of memory cells in the memory 63 is the same as the number of cells of the sensor portions (sensing means) 61. The charge from the sensor portion 61 migrates to the vertical transfer register 62, after which it is transferred to the memory 63 in the vertical retrace interval. Thereafter, the charge is transferred to the horizontal transfer register 64, whence it is read out through the output amplifier 65.

The sectional view taken along line A—A' of the CCD of FIG. 8 and a diagram illustrating the states of potentials at various portions corresponding to this cross section are similar to those of FIG. 6. In addition, the mechanism for sweeping out the electric charge and the mechanism for transferring the electric charge from the sensor portion 61 to the vertical transfer register 62 are similar to those of the prior art described earlier.

The foregoing is the description of the FIT-type CCD.

Next, the operation of the VOD-type CCD image sensor shown in FIG. 9 will be described.

Figure 9:
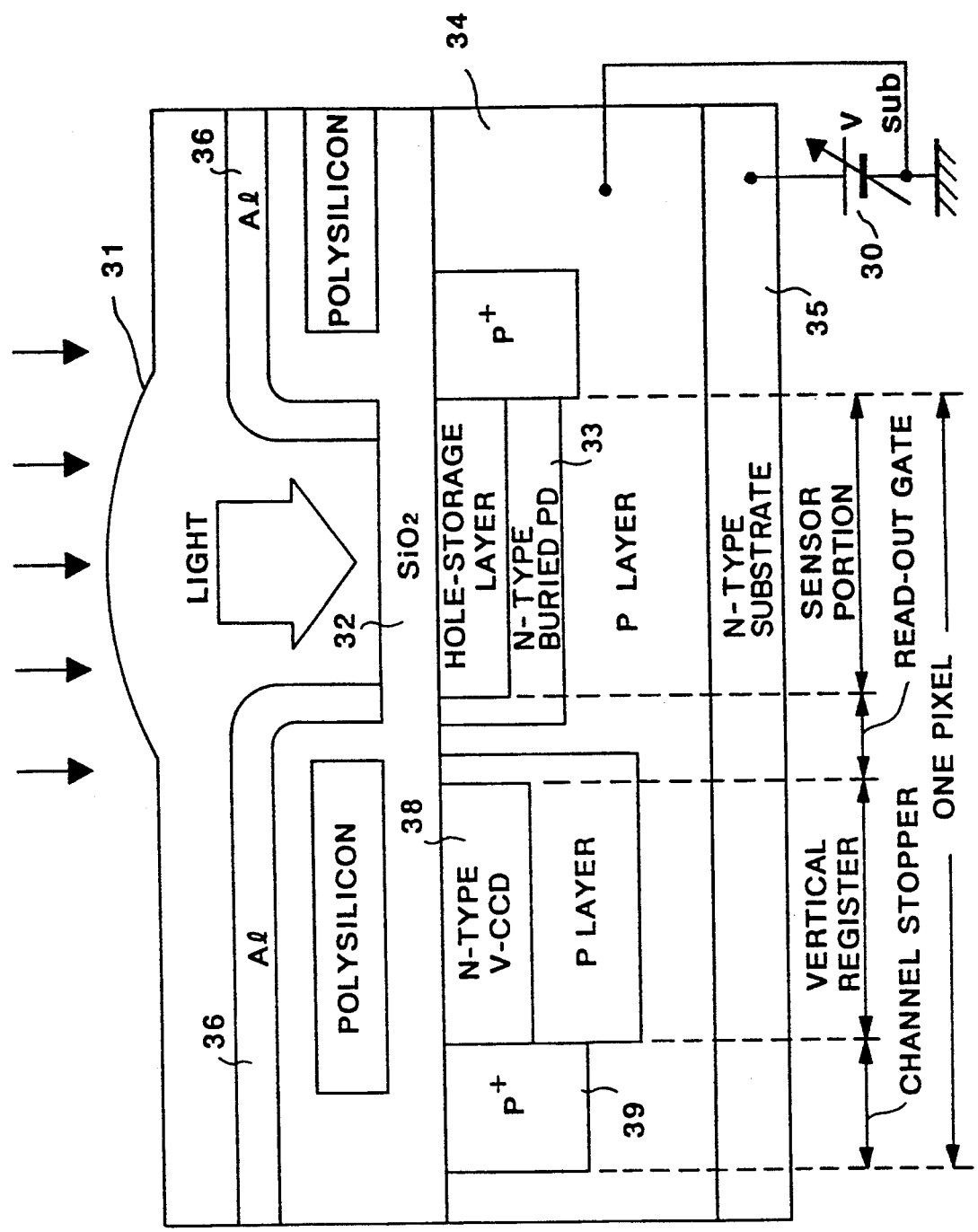
FIG. 9 is a sectional view schematically illustrating the structure of a VOD-type CCD.

As shown in FIG. 9, light (indicated by the arrows) from a subject is received by a photodiode (PD) of a sensor portion 33 via an oxide layer (SiO$_2$) 32 and a hole-storage layer for reducing dark current. Unnecessary light is prevented from impinging upon portions other than the sensor portion by an aluminum layer (Al) 36 acting as a shield. Owing to this shutting out of incident light, the light-receiving area of the CCD cannot be utilized effectively and the aperture efficiency declines. In the present embodiment, a condensing lens 31 for the purpose of compensating for this decline in aperture efficiency is provided for each pixel.

The electric charge produced by photoelectric conversion migrates to a V-CCD (vertical transfer register) 38 for vertical transfer. Here the charge is successively transferred in two dimensions and is outputted as a voltage value from a read-out amplifier.

Each pixel is provided with channel stopper 39 which separates the charge produced by each pixel, thereby preventing the charges from mixing. A P layer 34 underlies the sensor portion 33, and an N-S layer underlies the P layer 34. Discharging of unnecessary charge is performed by a substrate bias potential $V_{sub}$ 30 developed across these two layers.

FIG. 10 is a diagram illustrating the charge elimination operation of the VOD-type CCD in terms of a change in state of potential. The line indicated by "CHARGE" is a potential diagram indicative of the storage of photoelectric charge, and the line indicated by "DISCHARGE" is a potential diagram indicative of the elimination of unnecessary charge. In the "CHARGE" state, electric charge accumulates in the depression at the top of the diagram. In the "DISCHARGE" state, $\Delta V_{sub}$ is superimposed upon the substrate voltage $V_{sub}$, producing $V_{sub}+\Delta V_{sub}$ which causes the depression to vanish, as a result of which the accumulated charge is cast out toward the bottom of the diagram.

It should be noted that the P layer is disposed below the layer of the N-type V-CCD in order to prevent an unnecessary charge having a long recombination time from penetrating from below and mixing with the charge in the vertical transfer register 38 as noise at the time of unnecessary charge elimination.

Figure 11:
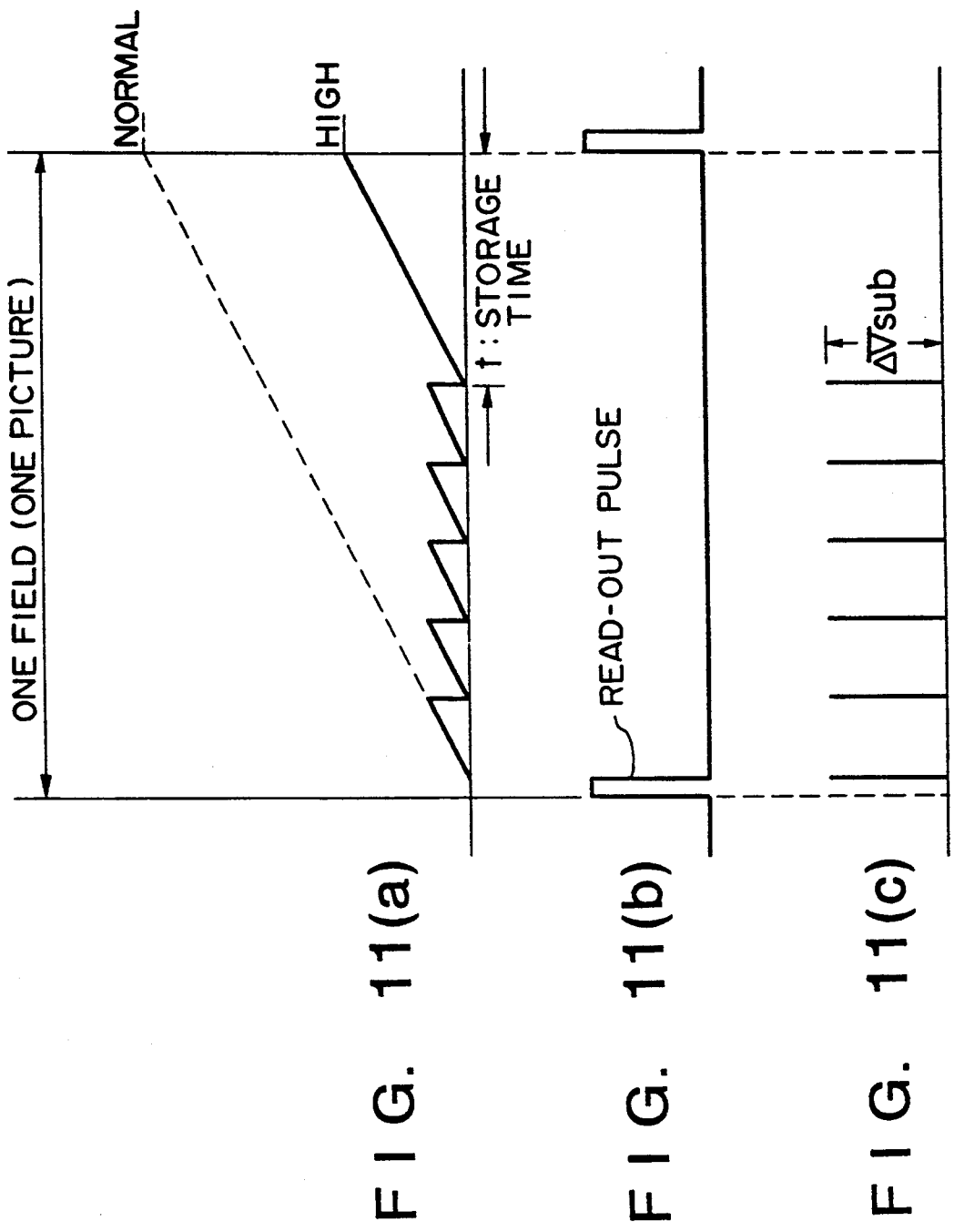
FIGS. 11(a) through 11(c) show a timing chart illustrating the operation for eliminating unnecessary charge in a VOD-type CCD.

FIG. 11 is a timing chart showing a change in the potential $V_{sub}$ at the operation of the above-described high-speed shutter. First, in one field interval of a standard television signal, the $V_{sub}$ potential is varied in pulsed fashion at a predetermined time interval, as shown in (c) of FIG. 11, so that the elimination of the unnecessary charge stored in the sensor portion 61 is repeated until a prescribed time. Thereafter, storage of the photoelectric charge is performed for a time t in the latter half of one field interval (one picture), and the stored charge indicated by "HIGH" is read out as image information by a read-out pulse shown in (b) of FIG. 11. Thus, a high-speed shutter effect for carrying out storage for time t is obtained. The difference in the manner of charge storage is illustrated in FIG. 11(a), in which "NORMAL" indicates operation at the time of ordinary storage and "HIGH" indicates storage at the time of the high-speed shutter operation.

The characterizing operation of this embodiment will be described below based upon the basic operation of the CCD set forth above.

Figure 12:
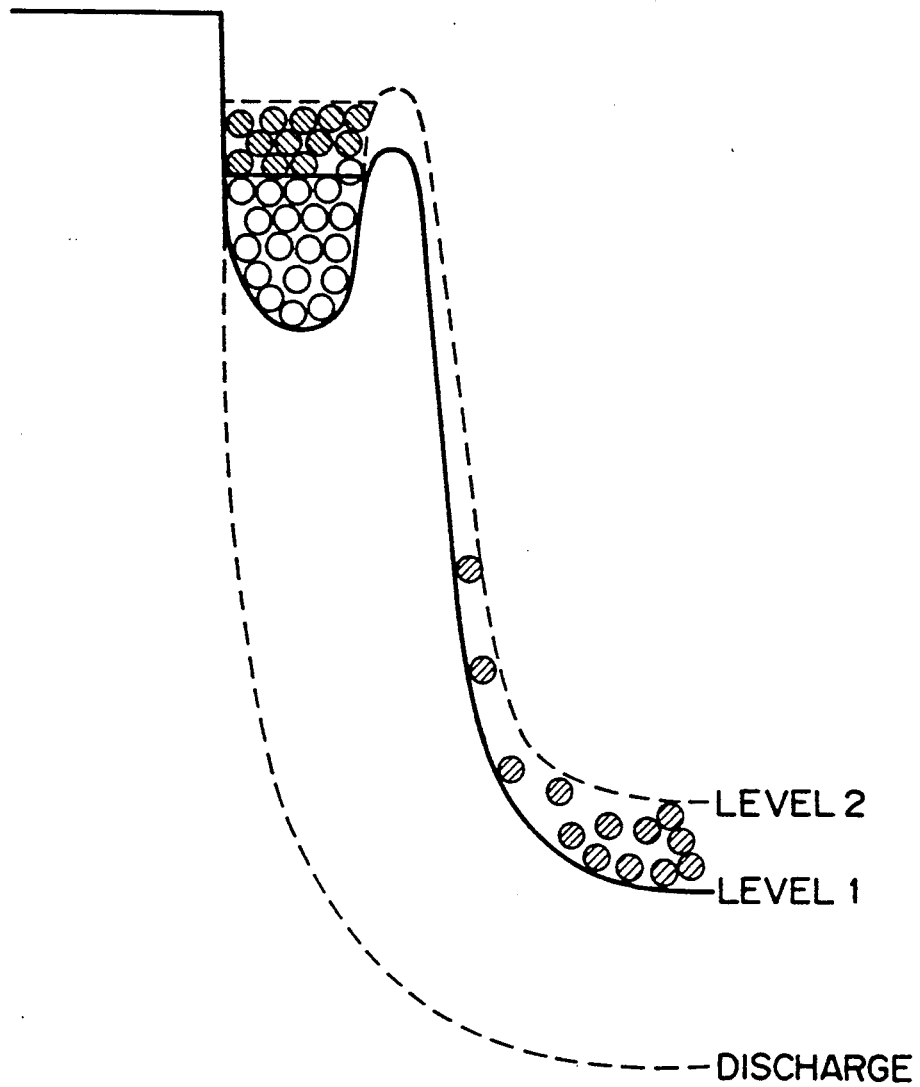
FIG. 12 is a diagram showing the manner in which potential level is controlled.

It has been stated above that the shape of the depression in potential can be changed by varying the substrate voltage Vsub in the VOD-type CCD. However, the amount of storable photoelectric charge in the depression can be controlled by applying a very small potential change rather than varying $\Delta V$sub by a large amount in pulsed fashion. FIG. 12 illustrates the manner in which plural levels of the $V_{sub}$ potential are set and control is performed selectively. In comparison with LEVEL 1, the potential depression is set to be deeper at LEVEL 2, whereby a larger amount of electric charge is capable of being stored than at LEVEL 1.

Conceptually, the ease of charge overflow is controlled by controlling the $V_{sub}$ potential, with the black circles in FIG. 12 occupying the difference between the two levels. This illustrates the manner in which overflow occurs. The storable amount of charge is that indicated by the white circles at LEVEL 1. At LEVEL 2, the storable amount of charge is the total of charge indicated by the black circles, namely the total of both the white and black circles. By thus controlling the $V_{sub}$ potential, the saturated charge level (the storable amount of charge) can be changed at will.

FIG. 13 is a timing chart showing an example in which the above-described control of $V_{sub}$ is performed and a changeover is made between the state of LEVEL 1 and the state of LEVEL 2 at a prescribed timing in one picture.

After unnecessary charge is eliminated, storage of photoelectric charge is performed up to the saturated charge level of MAX ① for time $t_1$ in the LEVEL 1 state, then storage of photoelectric charge is performed up to a raised saturated charge level MAX ② for time $t_2$ in the LEVEL 2 state. This is followed by reading of the stored charge. Here ① represents the saturated charge level (storable amount of charge) which prevails when the potential of $V_{sub}$ is in the LEVEL 1 state, and ② represents the saturated charge level which prevails when the potential of $V_{sub}$ is in the LEVEL 2 state.

Figures 13A, 13B, 13C:
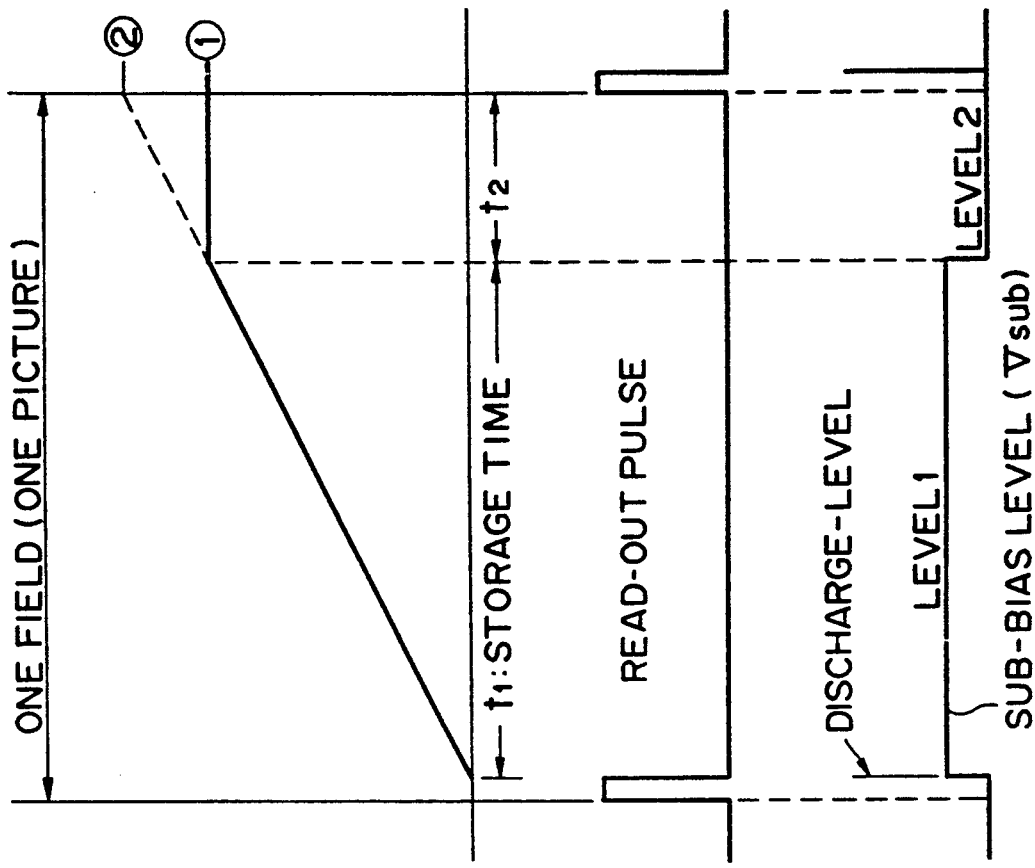
FIGS. 13(a) through 13(c) show a timing chart showing the manner in which potential level is controlled.

In accordance with the operation described above, charge which exceeds the saturated charge level ① overflows and clipping occurs at the high-luminance portion, as illustrated by the characteristic of the flat portion indicated by the solid line in FIG. 13(a), within the initial time period $t_1$ in one picture. If the saturated charge level ① is 100%, for example, light from the subject having a luminance in excess of this value is clipped in its entirety. Next, control is changed over in the latter half of one picture, the $V_{sub}$ potential is placed in the LEVEL 2 state and the saturated charge level also is raised to ② to provide some extra margin for storage, in which state storage of the photoelectric charge is continued for time $t_2$.

If $t_1+t_2=1/60$ sec for the NTSC television signal, then $t_1=1/60-1/500=1/60$ sec in a case where $t_2=1/500$ sec.

This indicates that, in consideration of the fact that the 1/60 sec, 1/125 sec, 1/250 sec and 1/500 sec exposure stages of a camera correspond to single steps (stops) in terms of a diaphragm, $t_2$ is the suitable exposure for a subject having a luminance three stops higher than a subject whose suitable exposure is $t_1$.

Assume that a luminance difference equivalent to three stops exists between the main subject and the background in a backlighted state. A picture corresponding to the BLC-ON state (the backlighting correction state) of the prior-art example is imaged during time $t_1$, the appropriate exposure is achieved for the main subject and the background is clipped owing to its high luminance. In exposure during time $t_2$, a picture corresponding to the BLC-OFF state (the state in which no compensation is made for backlighting) of the prior-art example is imaged, the appropriate exposure is achieved for the background portion, which is three stops brighter than the main subject, and the main subject almost fails to appear. The charge accumulated during time $t_1$ and the charge accumulated during time $t_2$ are added by the photoelectric storage portion of each pixel, and a picture of the kind shown in FIG. 4(b) is obtained as a result.

Figure 14:
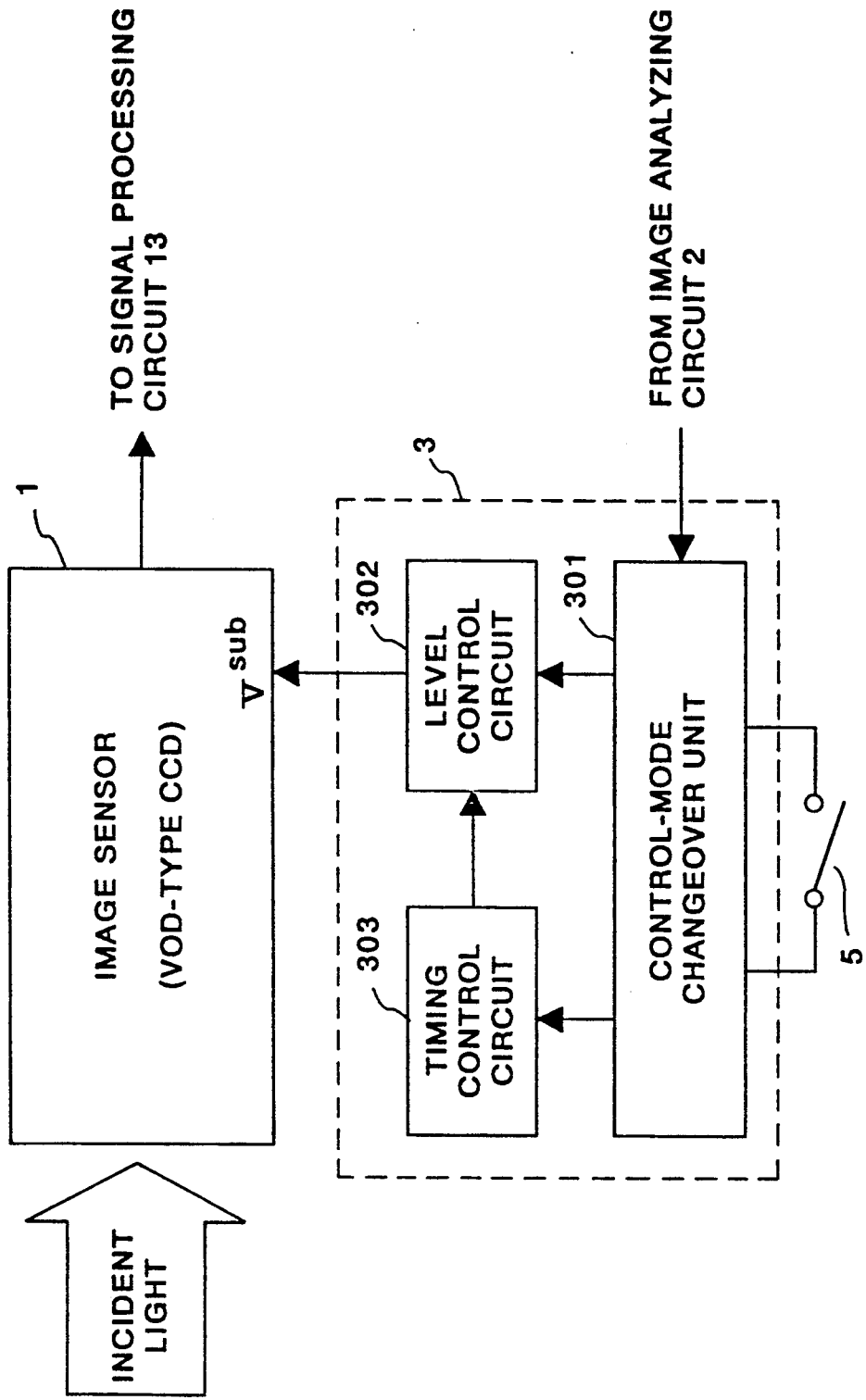
FIG. 14 is a block diagram illustrating the construction of a controller.

FIG. 14 illustrates an example of the construction of the controller 3 described in FIG. 3. As mentioned earlier, the controller 3 is supplied with, e.g., information indicative of a luminance histogram from the image analyzing circuit 2, and controls the drive of the image sensor 1 in conformity with the mode selected by the mode changeover switch 5.

Upon receiving the selection signal from the mode changeover switch 5, a control-mode changeover unit 301 sets the driving mode of the controller 3 to either the NORMAL mode (ordinary photographic mode) or BLC-ON mode (backlighting correction mode).

In the case of the NORMAL mode (ordinary photographic mode), the $V_{sub}$ potential (the substrate voltage value) is set to the state shown at LEVEL 2 in FIG. 12 so as to attain the maximum value of the saturated charge level decided by the performance of the image sensor 1 per se.

Figure 15:
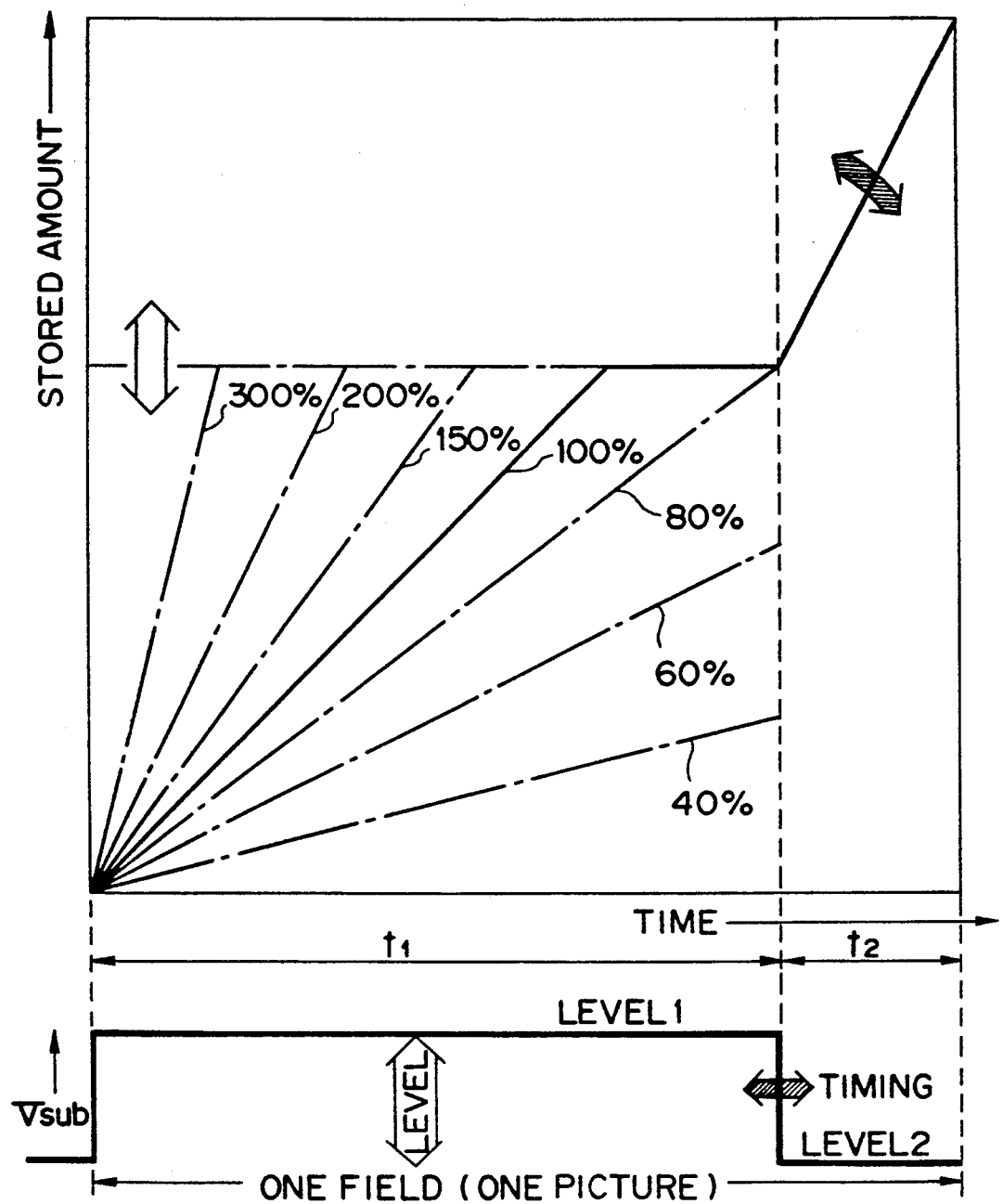
FIG. 15 is a diagram illustrating the non-linear characteristic of a photoelectric conversion.

In the case of the BLC-ON mode (backlighting correction mode), $V_{sub}$ is changed over between LEVEL 1 and LEVEL 2 in FIG. 12 in the course of photographing one picture. Here the setting of the changeover timings ($t_1$ and $t_2$) and the setting of the saturated charge level of LEVEL 1 are performed respectively by a timing control circuit 303 and a level control circuit 302 based upon the results of image analysis of the aforementioned luminance histogram or the like. The overall photoelectric conversion characteristic which varies depending upon the settings of the level and timing is non-linear, as depicted in FIG. 15. The manner in which the characteristic changes depending upon the level setting is indicated by the white arrows, and the manner in which the characteristic changes depending upon the timing setting is indicated by the black arrows.

The relationship between the backlighting-correction effect and image analysis according to this embodiment will be described with reference to FIGS. 16(a) and 16(b), which illustrate examples of luminance histograms.

The automatic exposure adjusting mechanism of a video camera or the like ordinarily controls an iris or the like in such a manner that the integrated value of one picture of a luminance signal will approach a predetermined value. To this end, the iris 11 is controlled in the same manner in a case where the integrated value of one picture of a luminance signal is the same even if the distribution of brightness in one picture differs, as indicated by the curves a and b of the luminance histogram shown in FIG. 16(a). The curve a is a distribution pattern, which is readily produced at the time of backlighted photography, indicative of the occurrence frequency of luminance, and the curve b is a distribution pattern, which is readily produced at the time of frontlighted photography, indicative of the occurrence frequency of luminance.

When the BLC-ON mode (the backlighting correction mode) is selected by the mode changeover switch 5 in order to compensate for backlighting, the BLC switch 19 is closed and a transition is made from the curve a to the curve c shown in FIG. 16(b). Since the base of the image pick-up signal for which darkening of the subject would occur is raised and made to approach the aforementioned predetermined value (indicated by the one-dot chain line) serving as the criterion for appropriate exposure, the image pick-up signal of the bright portion causes high-luminance clamping and, in terms of the occurrence frequency, the pattern becomes one shifted toward the bright portion.

Next, the washed-out portion of curve c is converted to an appropriate exposure state by the non-linear processing of FIG. 15. Consequently, the hatched section of FIG. 16(b) is converted to the hatched section of the bright portion of curve b in FIG. 16(a) as in the manner of a dead zone, and an image approximating the front-lighted state is obtained as the result.

Accordingly, if the characterizing features of image analysis described above are utilized and prescribed processing is executed within the timing control circuit 303 and level control circuit 302, then it will be possible to set the changeover timing of LEVEL 1 and LEVEL 2 as well as saturated charge level of LEVEL 1.

Though there is the possibility that a discontinuity in the luminance level or a level reversal will occur in certain portions after the backlighting correction, no problems arise since the probability of such an occurrence is extremely low at the time of backlighting.

The manner in which the potential of LEVEL 1 (the saturation level of charge) is set will be described next.

FIG. 17 illustrates the relationship between storage time t (plotted along the horizontal axis) at various intensities (25%, 50%, 100%) of incident light and the amount of stored charge (plotted along the vertical axis) in a case where potential level is changed to set three charge saturation levels indicating ease of photoelectric charge overflow.

It is assumed here that when a potential level is set in such a manner that the saturation level (1) becomes the intermediate clipping point of the output signal, the light of incident intensity 25% attains the saturation level ① exactly at $t=t_1$, and light of incident intensity 800% attains the maximum saturation level ② exactly at time $t=t_2$. Similarly, at level ①', the light of incident intensities of 50% and 400% saturates at $t_1$ and $t_2$, respectively. At level ①", the light of incident intensities of 100% and 200% saturates at $t_1$ and $t_2$, respectively. The photoelectric conversion characteristic at this time is as shown in FIG. 18.

Figure 18:
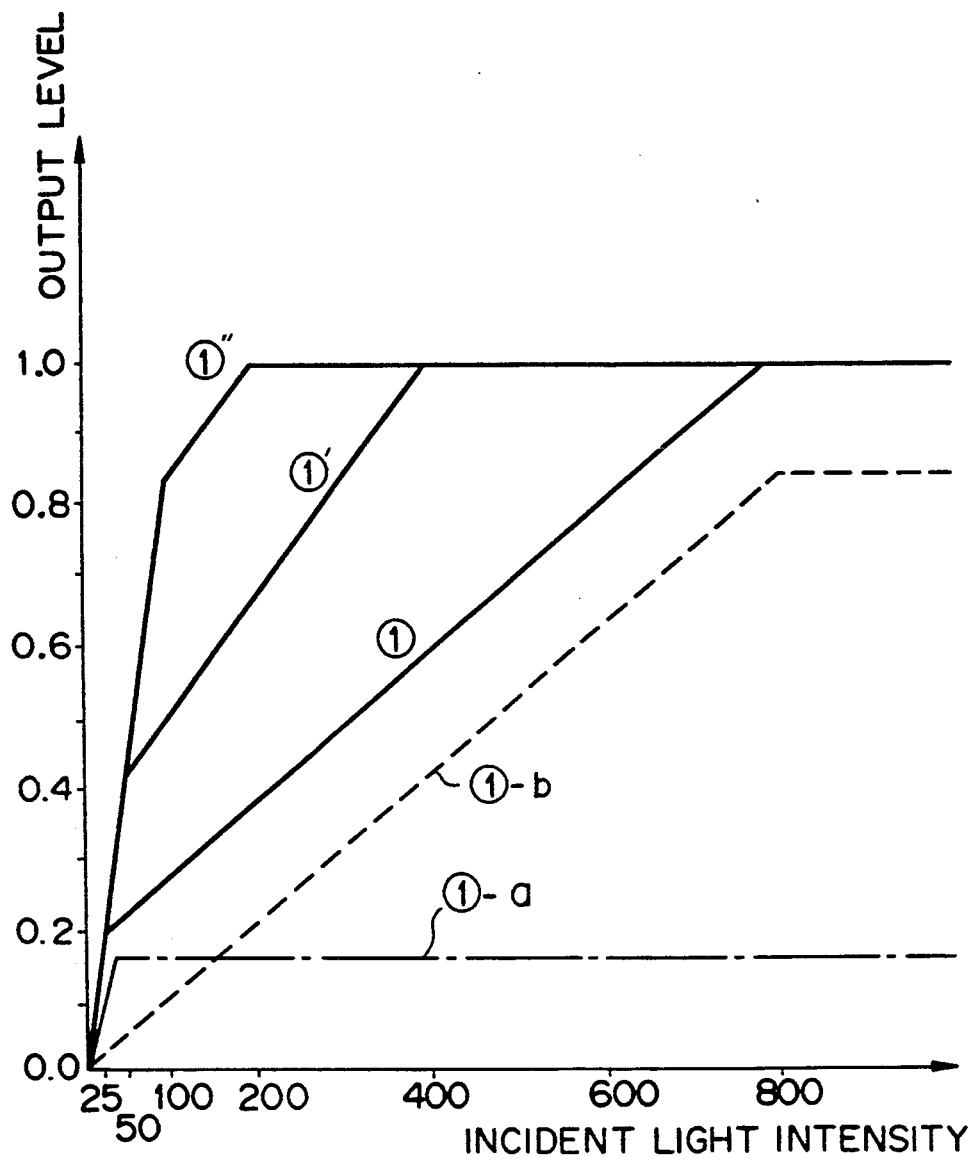
FIG. 18 is a diagram showing the relationship between an amount of incident light and the output level.

In FIG. 18, the one-dot chain line ①-a is the characteristic which prevails when the incident light intensity is 25%, and the dashed line ①-b is the characteristic which prevails when the incident light intensity is 800%. The characteristic obtained by combining these two characteristics is the solid line ①.

Thus, it will be understood that various photoelectric conversion characteristics can be obtained by varying the potential level.

An appropriate photoelectric conversion can be carried out by controlling the setting of the potential level by a video signal resulting from image pick-up.

FIGS. 19(a) and (b) illustrate conceptual diagrams of an example in which a video signal is subjected to histogram analysis by the image analyzing circuit 2. FIG. 19(a) illustrates the distribution of the occurrence frequency of luminance level Y, and FIG. 19 (b) illustrates a graph of the cumulative frequency thereof. Various methods of correlating the above-described potential-level setting and imaged picture are conceivable, and each has its own advantages. One example of such a method will be described here.

Figure 19B:
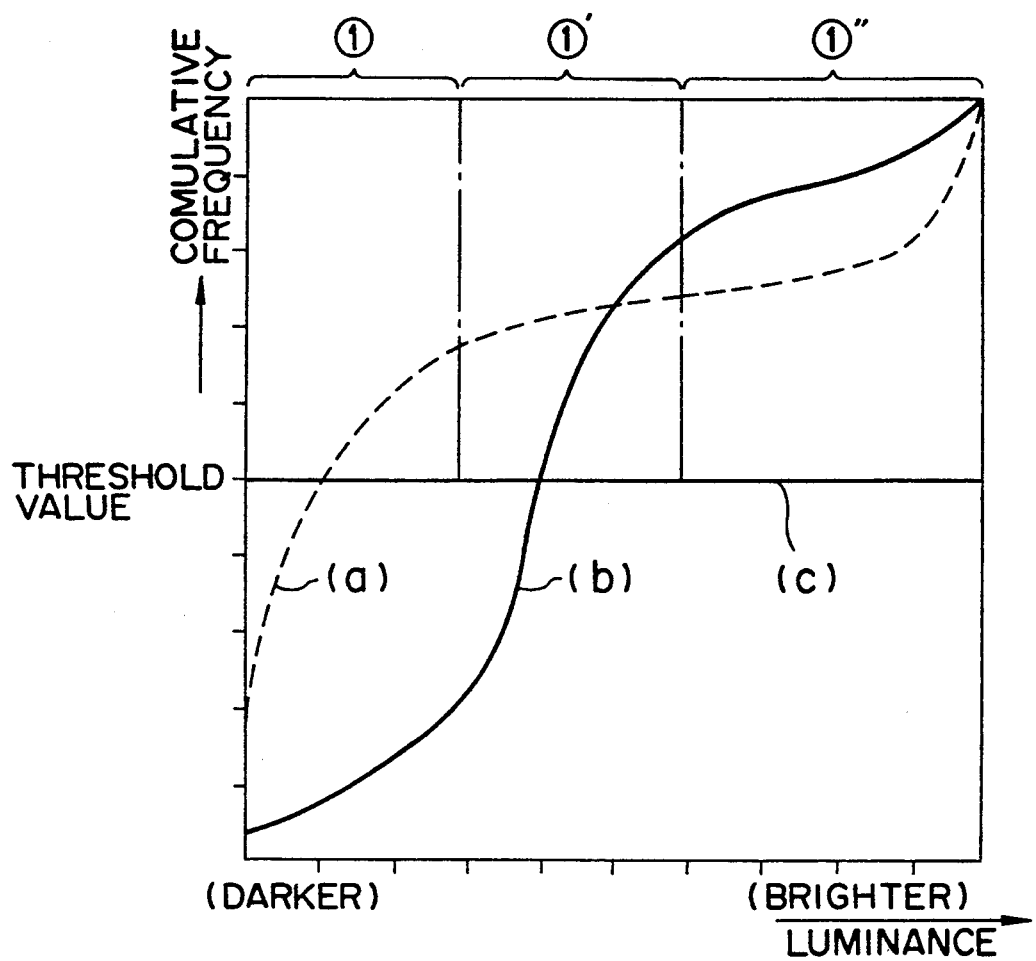

The dashed line (a) in FIGS. 19(a) and 19(b) indicates that the occurrence frequency concentrates in the dark portion, and that the bright portion concentrates at the MAX level believed to be clipped. In such a case, it is appropriate to set the potential level at level ① in FIG. 17 and strength the compression effect of the luminance difference in one picture.

The solid line (b) in FIGS. 19(a) and 19(b) is the occurrence frequency of the bright portion which concentrates at the intermediate-luminance level and does not produce excessive clipping. In this case, as opposed to the above, it is appropriate to set the potential level at level ①' in FIG. 17 and comparatively reduce compression of the luminance difference to make half-tone reproduction easier.

A judgment of this kind can be achieved by providing the cumulative frequency of FIG. 19(b) with a threshold value (solid line c) and effecting a division into classes (the three areas ①, ①', ①" indicated by the one-dot chain lines) at the luminance levels which prevail when the cumulative frequency reaches 50%, by way of example. In other words, it will suffice to set the potential at level ① if the point at which the luminance level reaches the threshold value is within range ①, at level ①' if the point at which the luminance level reaches the threshold value is within range ①', and at level ①" if the point at which the luminance level reaches the threshold value is within range ①". It is of course possible to have a computer make the judgment using more complicated judgment rules.

Figure 20:
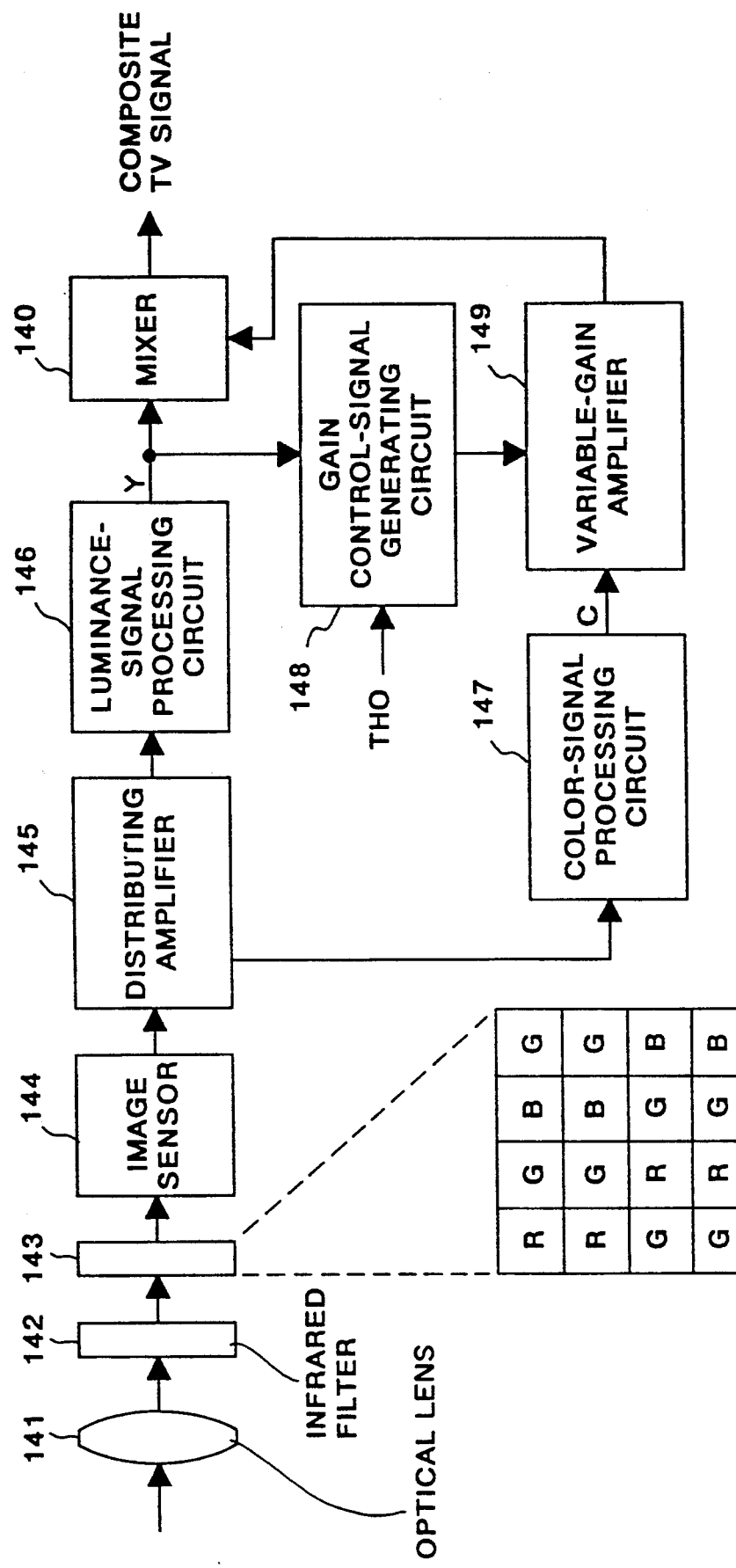
FIG. 20 is a block diagram showing the construction of a color video camera using a single-plate color filter.

Next, "high-luminance color-signal suppression", in which the occurrence of false colors is suppressed, will be described. FIG. 20 is a diagram showing the construction of a color video camera using a single-plate color filter.

Light from a subject, which has entered from an image pick-up optical lens, impinges upon an infrared filter 142. The latter eliminates infrared light, which is an unnecessary wavelength region, from the entrant light. The resulting light impinges upon a color filter 143, where a distribution of colors for color image pick-up is performed among the pixels of an image sensor 144. The latter outputs an image pick-up signal containing color information. A distribution amplifier 145 distributes information relating to contrast to luminance-signal processing circuit 146 and color information to a color-signal processing circuit 147. In other words, the amplifier 145 outputs so-called Y- and C-signals.

If, as shown in FIG. 21(a), one of the primary colors (or complimentary colors) distributed by the color filter exhibits a high luminance and therefore saturates by exceeding the saturated charge level (the storable amount of charge) indicated at ②" while the other colors do not saturate, the color balance deteriorates and a color different from that of the light from the subject is outputted. Accordingly, a gain control-signal generating circuit 148 generates a control signal for realizing a gain characteristic of the kind shown in FIG. 21(b) in order that a variable gain amplifier 149 will reduce the mu-factor of a color signal having a luminance level which exceeds a threshold value TH2 shown in FIG. 21(a). Thereafter, the luminance and color signals are mixed by a mixer 140 and outputted as a composite TV signal.

In this embodiment, a plurality of saturation charge levels of pixels are set in one picture, and therefore it is necessary to set correspondingly a plurality of points at which the color-signal mu factor is reduced.

Figure 23A:
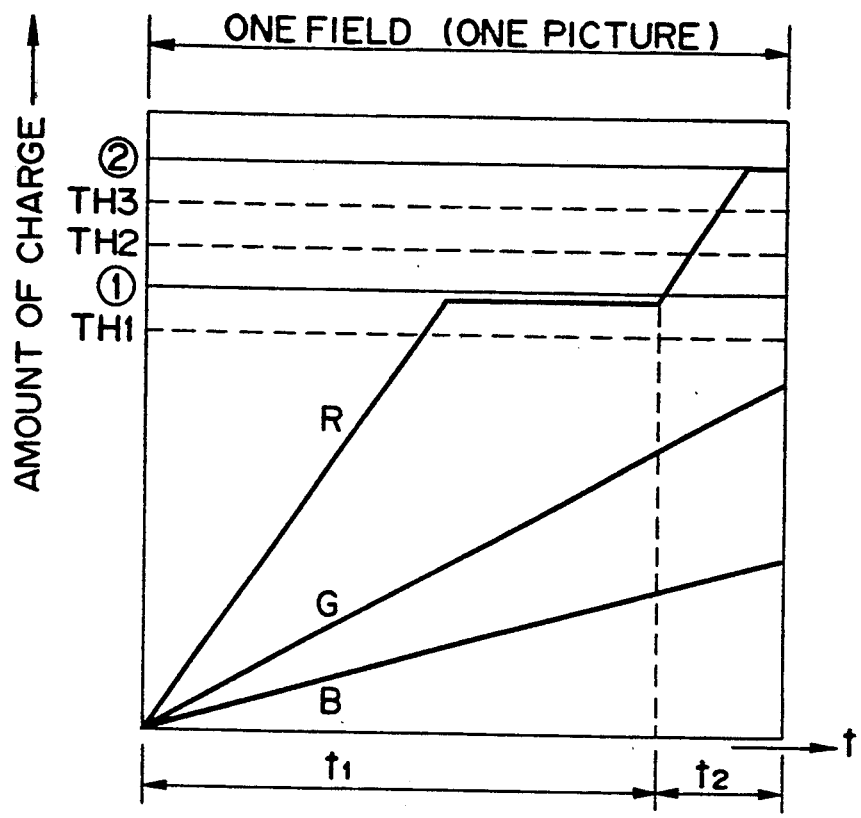
FIGS. 23(a) and 23(b) are diagrams showing the relationship between threshold values and saturated charge level.
Figure 23B:
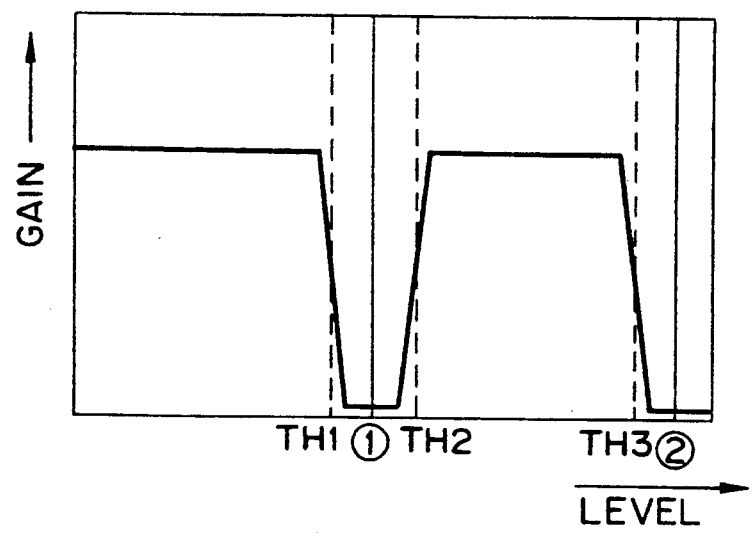

FIG. 22 is a block diagram showing only the portion of circuitry dealing with color signals. As in the case of FIG. 20, Y and C signals are outputted. These signals enter a threshold-value generating circuit 160, which generates a plurality of threshold values corresponding to the pixel saturation charge levels and applies these threshold values to a gain-control signal generating circuit 161. FIGS. 23(a), (b) respectively illustrate the relationship between these saturation charge levels ((①, ②)) and threshold values (TH1, TH2, TH3) and the relationship between the threshold values and gain characteristic.

With regard to level ① at which saturation occurs early in terms of time, a window comparator mode is adopted and therefore two threshold values (TH1, TH2) are set with respect to one level. Gain is reduced between these two threshold values. This makes it possible to suppress a false color signal at an intermediate luminance level in the imaged picture. A false color signal at a high luminance can be suppressed by the threshold value TH3 in the same manner as in the case of FIG. 21(a) and 21(b).

A method of performing exposure control (the aforementioned iris control) for low-luminance area video and a method of performing exposure control (the aforementioned setting of time period $t_2$) for high-luminance area video based upon image information of the entirety of one picture have been described above. A method will now be described in which video signals cut from individual areas of one picture are used in each of these two types of exposure control.

Figure 25:
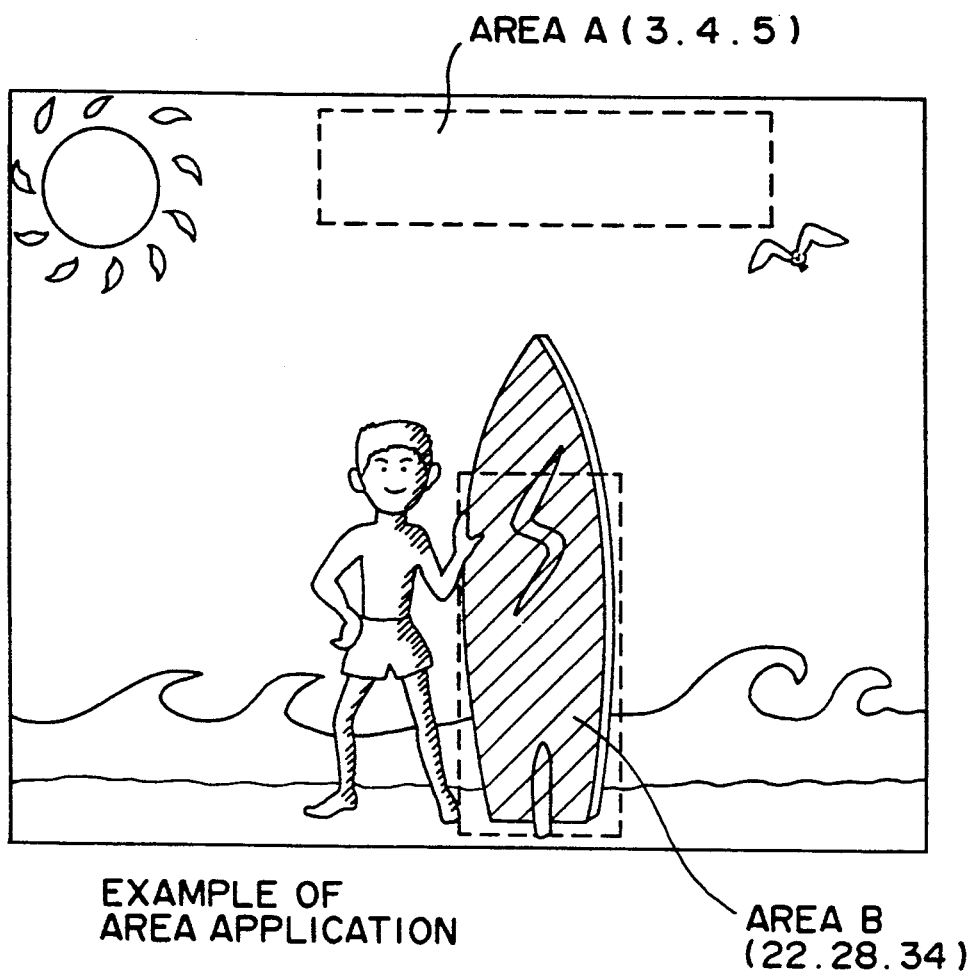
FIG. 25 is a diagram showing an example in which image division is applied to backlighted photography.

FIG. 24 illustrates an example in which an image is divided into a plurality of areas. In this example, there are 36 subdivisions of equal area. An example in which these 36 image subdivisions are applied at the time of backlighted photography is shown in FIG. 25. Here, an area A (3, 4, 5) is selected as a typical area from a high-luminance portion, and an area B (22, 28, 34)) is selected as a typical area from a low-luminance portion. The areas A and B each have identical numbers of blocks (three blocks each) in this example. However, in a case where the numbers of blocks differ, it will suffice to supplement these with weighting coefficients.

By performing independent exposure control for each of the low- and high-luminance portions using the signals of these areas, it will be possible to photograph video signals compressed to an appropriate dynamic range for the overall picture.

Figure 26:
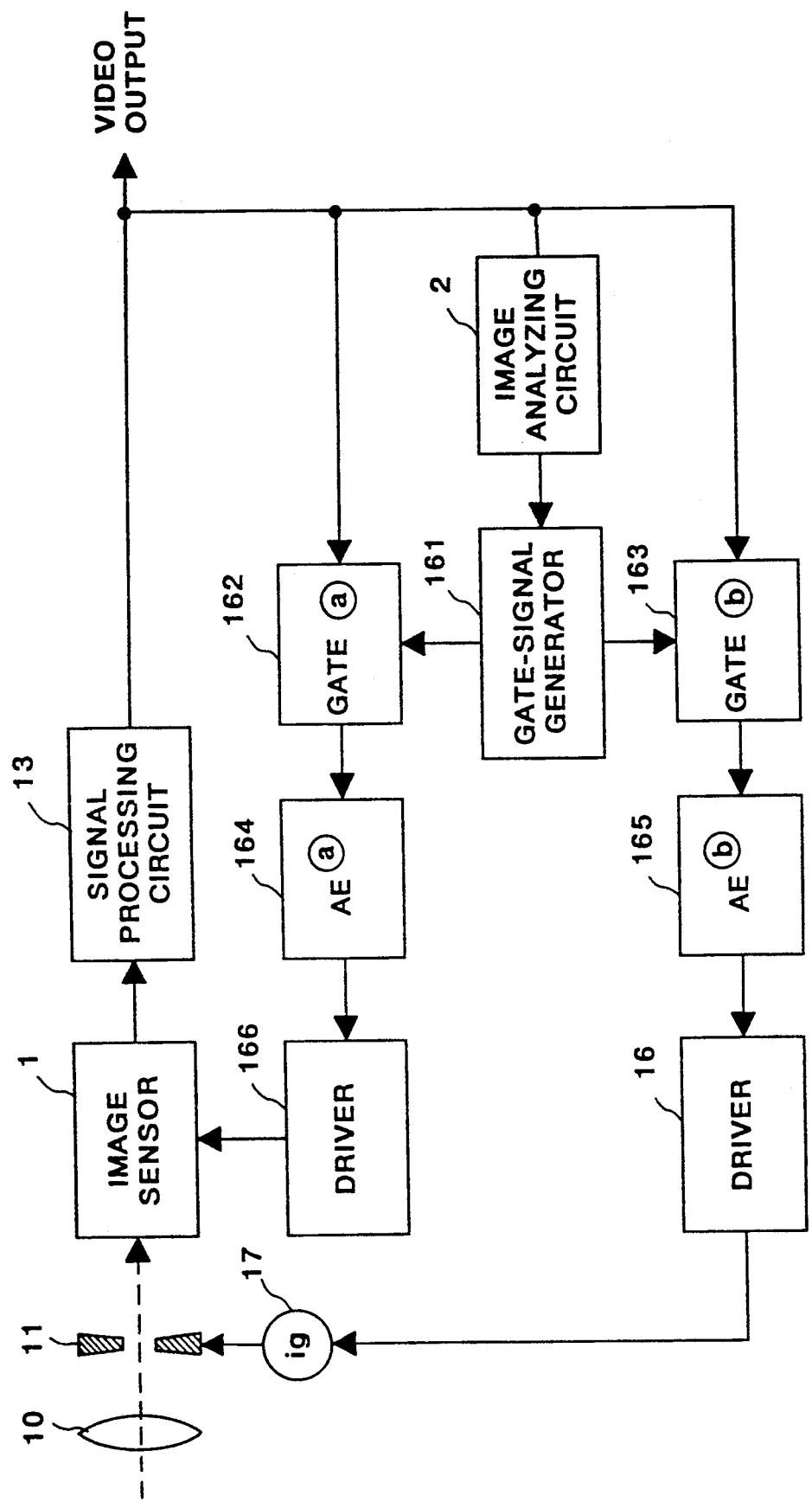
FIG. 26 is a block diagram showing the specific construction of a circuit in a case where exposure control based upon image division is carried out.

FIG. 26 illustrates a specific example of a circuit arrangement for exposure control based upon image division. The signal resulting from image pick-up is analyzed by the image analyzing circuit 2, such as the aforementioned luminance histogram analyzing means, and several blocks of areas having a high occurrence frequency of high and low luminances are selected starting from the higher order blocks. Based upon the video signals indicative of these areas of several blocks, a gate signal generating circuit 161 generates a control signal for controlling the ON/OFF action of a gate ⓐ 162 and a gate ⓑ 163 corresponding to the areas A and B, respectively.

Exposure control circuits AE ⓐ 164, AE ⓑ 165 generate control signals for drivers 166, 16 using the video signals selected by the above-mentioned gates. In a simple example, AE ⓐ 164 is for setting $t_2$ and therefore is an AE based upon a shutter speed for a high-luminance area. AE ⓐ 165 is an AE based upon an iris for a low-luminance area. This is just a simple example and there are various other AE methods. These know methods can be utilized in control of each of the areas.

When tones are capable of being expressed for both the main subject and background owing to the effects of this embodiment, situations arise wherein expression of video in which the background is intentionally defocused is sought by performing a manual operation, as opposed to an automatic operation. Accordingly, an exposure adjustment operation performed when using a manual iris will now be described.

Figure 27A:
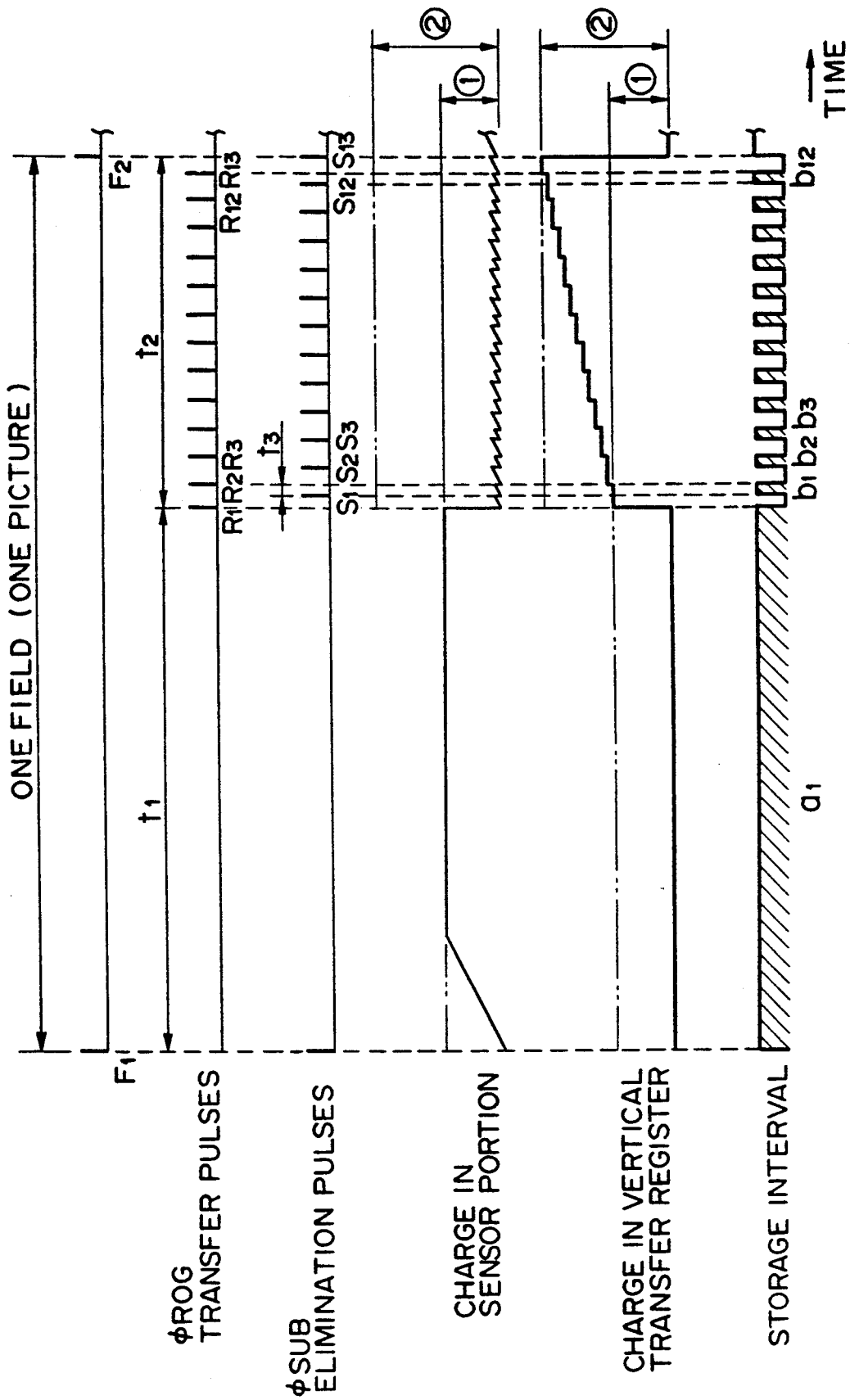
FIGS. 27(a) through 27(c) are timing charts showing the exposure operation when a manual iris is used.

FIG. 27(a) illustrates an example of an exposure operation when using a manual iris. First, at the beginning of one picture, storage of photoelectric charge for low luminance is performed continuously for time $t_1$, with the saturated charge level of the sensor portion being ①. The sensor portion which receives the light from the high-luminance portion (background) of the picture develops overflow at the initial stage of time $t_1$, as illustrated. Thereafter, φROG transfer pulses and φSUB elimination pulses are driven in the manner illustrated in a state where the saturated charge level has been set high over time $t_2$ in the latter part of one picture, thereby performing storage for a storage time $t_3$ in a dispersed manner (a multiple-exposure operation by an FIT-type CCD) and carrying out storage of photoelectric charge for high luminance.

This multiple-exposure operation by an FIT-CCD refers to performing storage of photoelectric charge in dispersed fashion within a predetermined period of time. The manner in which the saturated charge level of the sensor portion changes is indicated by the two-dot chain line.

As a result of this operation, high-luminance photoelectric charge is added, on the vertical transfer register of the FIT-type CCD whenever fine storage of charge is performed by multiple exposure, to the charge clipped and stored by the sensor portion and transferred to the vertical transfer register during the low-luminance photoelectric charge storing interval. If the state of the subject does not change and the storage state of FIG. 27(a) is such that the F-stop is F8, the shutter speed must be varied by two steps (¼) overall in a case where the F-stop is changed by two steps (¼ the quantity of light) to F4 to defocus the background and obtained a shallow depth of field.

Figure 27B:
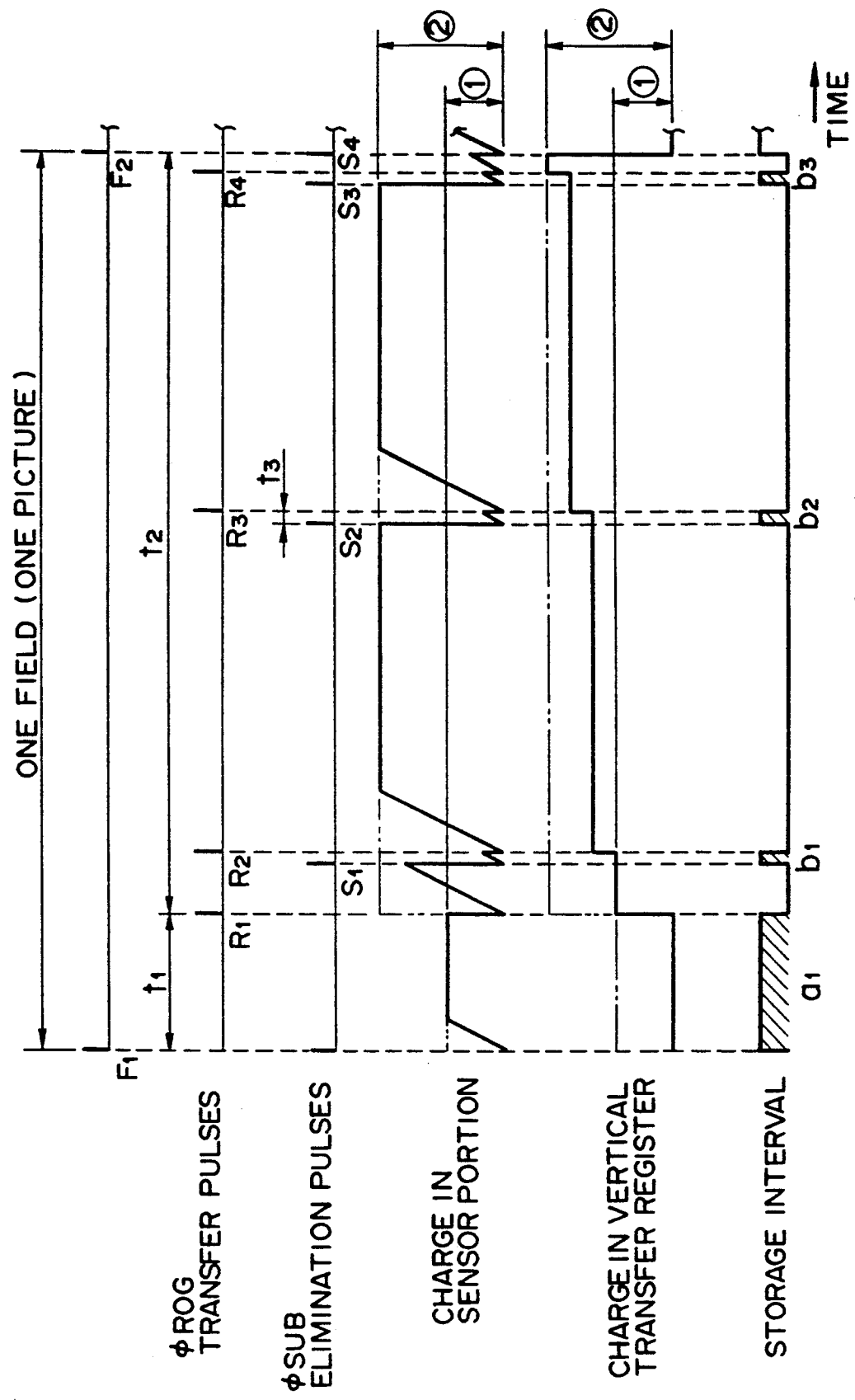

Two examples shown in FIGS. 27(b), (c) are illustrated as exposure states to be set anew.

In FIG. 27(b), low-luminance exposure is arranged at the very beginning of the picture, light is stored continuously for ¼ the time, and high-luminance storage is dispersed evenly in the remaining portion of the picture.

In FIG. 27(a), there are 12 storage intervals ($b_1, b_2, \ldots b_{12}$). In FIGS. 27(b) and (c), there are three storage intervals ($b_1, b_2, b_3$), namely ¼.

Figure 27C:
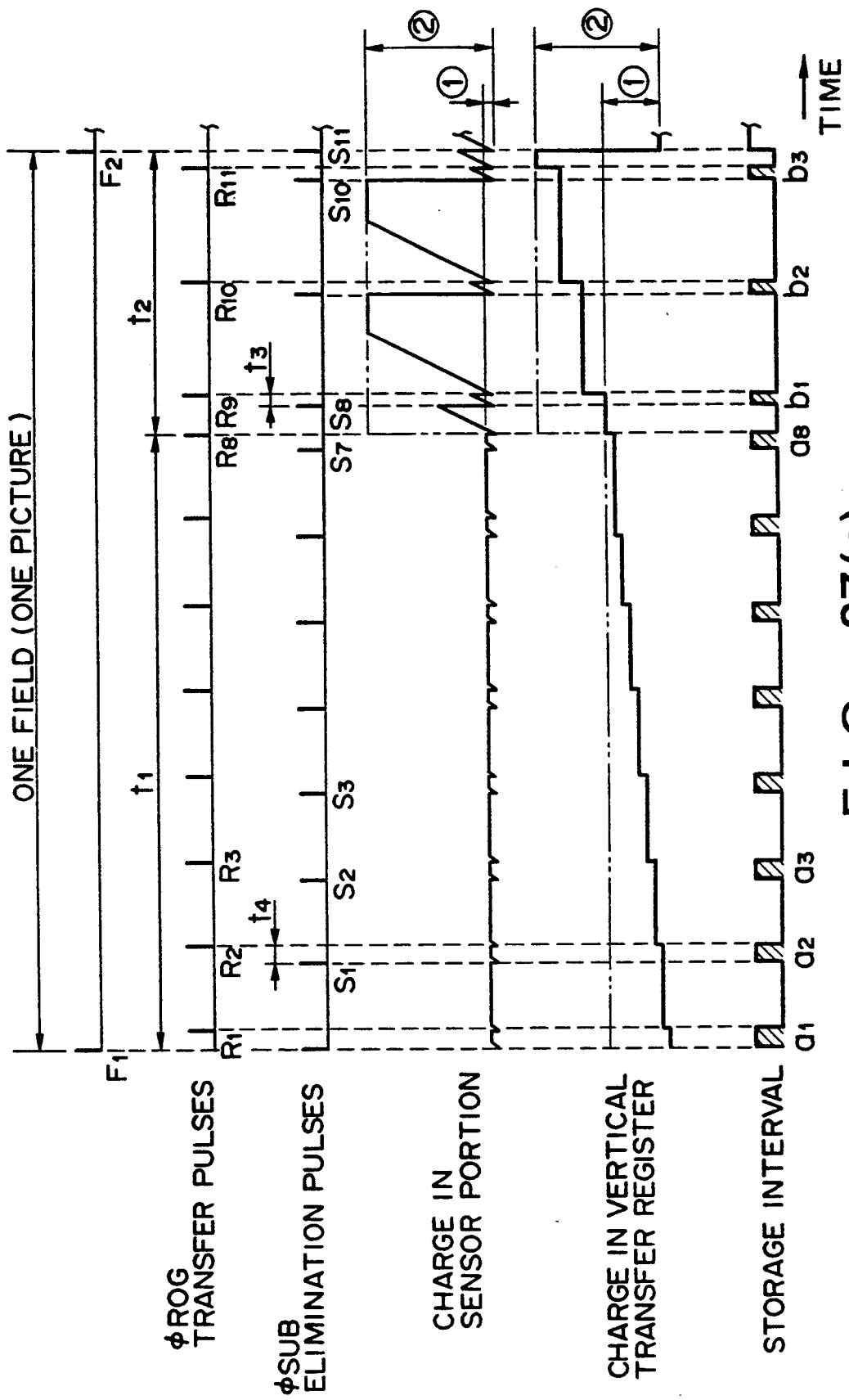

Next, in FIG. 27(c), it is arranged so that the total light storage time for low-luminance exposure becomes ¼ and is dispersed over the beginning portion of the picture. Storage inclusive of the light storage pulses for high-luminance is evenly dispersed in one picture.

When storage for low luminance is dispersed over one picture, an overflow of charge does not occur in each light storage interval if the saturated charge level ① is set to a value the same as that for the case where storage is not dispersed. Consequently, in FIG. 27(c), it is so arranged that overflow is produced by setting the saturated charge level ① to ①', which is lower than in the case where storage is not dispersed. Alternatively, by changing somewhat the structure of the FIT-type CCD, the saturated charge level can be changed from level ① to ② even in the vertical transfer register, so that the overflow operation can be made to take place in the vertical transfer register instead of the sensor portion, thereby making it possible to perform clipping.

Figure 28:
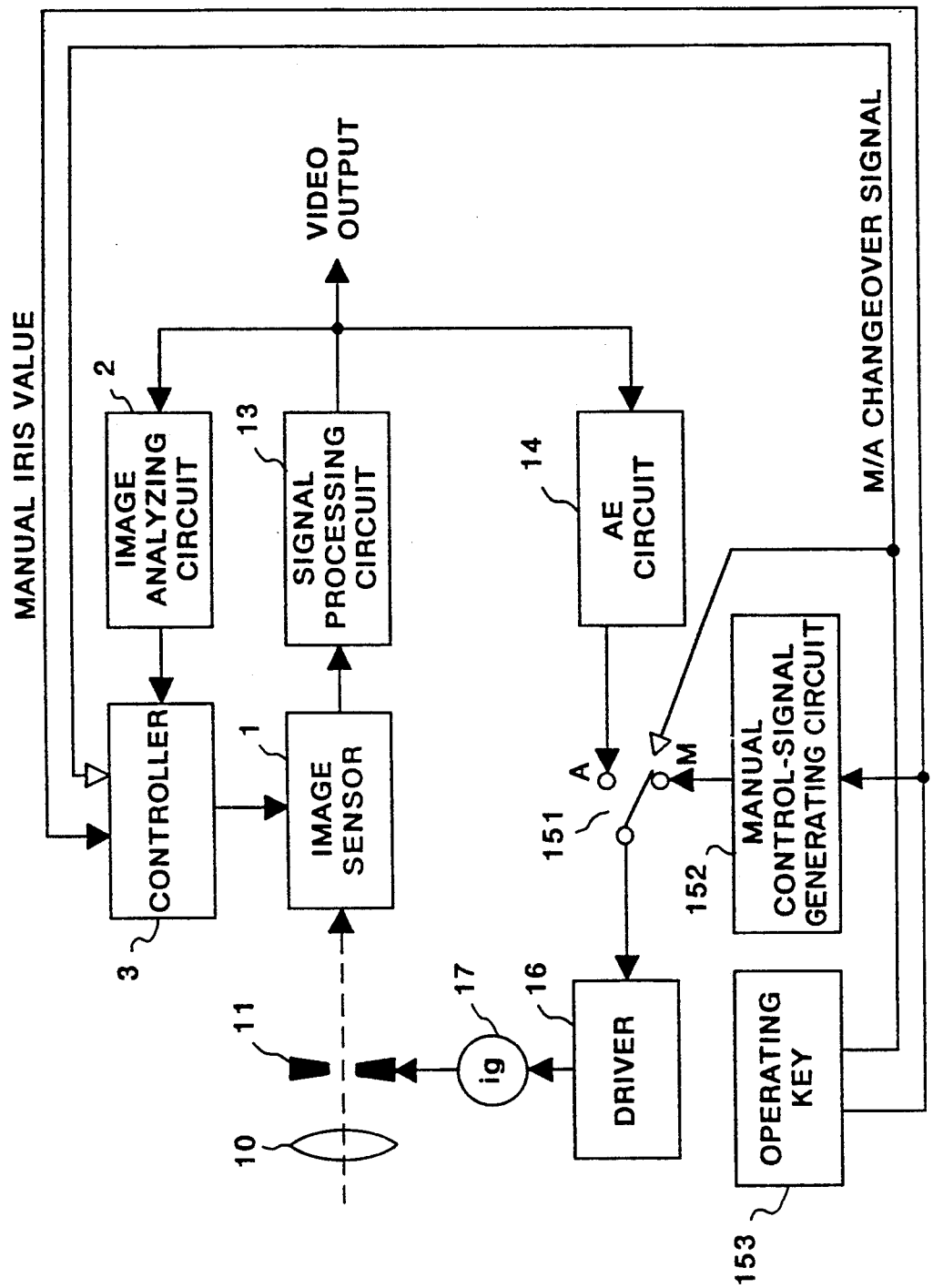
FIG. 28 is a block diagram showing an example of a circuit arrangement for performing photography by a manual iris.

FIG. 28 is a block diagram illustrating an example of an arrangement for realizing a manual iris operation.

In FIG. 28, a manual (M) or automatic (A) iris is selected by an operating key 153, thereby producing an M/A changeover signal which changes over the contact of an iris control-signal changeover switch 151 to the M side. The changeover signal is simultaneously supplied to the controller 3, which is the CCD control circuit.

Since the manual iris value also is transmitted to the controller 3, the latter calculates the factor by which the quantity of light will change and executes compression processing for compressing the storage interval by the above-described multiple-exposure operation.

Since the manual iris value is sent to a manual control-signal generating circuit 152, the driver 16 is instructed of a new set value for the iris by changeover of the switch 151, and the iris 11 is driven via the ig meter 17 to obtain a prescribed depth of field. Thus the image pick-up optical lens between the lens 10 and image sensor 1 is changed.

Thus, it is possible to set depth of field to a desired state while maintaining the condition that the amount of exposure be constant.

As described above, the saturated charge level of the sensor portion in the latter part of one picture is made higher than in the earlier part of the picture in order to make it more difficult for the photoelectric charge to overflow. As a result, after overflow has occurred at time $t_1$, an image of a high-luminance portion which is clipped in the prior art and could not be reproduced is capable of being reproduced according to this invention.

More specifically, by providing the VOD-type CCD, which is presently the most widely used, with simple control processing circuitry, a backlighting correction, which has been a major problem when performing photography with a video camera, can be carried out in an effective manner.

In particular, even a background portion which is washed out and cannot be reproduced using the conventional correction can be imaged at the same time as the main subject.

Further, $t_1$, $t_2$ are interrelated and control is performed in dependence upon the image information. Therefore, in a case where the luminance difference in one picture is small, high-luminance storage time $t_2$ is lengthened and $t_1$ is shortened correspondingly. However, in imaging a low-luminance portion, a photoelectric conversion time equivalent to that of ordinary photography is assured as long as overflow does not occur. As a result, a deterioration in the S/N ratio of the low-luminance portion does not readily occur.

In a case where finer tone representation is desired in a high-luminance area in a wide range of tones, the potential level of LEVEL 1 is set so as to facilitate overflow. This makes finer tone representation possible regardless of automatic or manual operation.

Since an ideal photoelectric conversion characteristic is set automatically in conformity with image information, it is no longer necessary for the cameraman to make judgments at the time of backlighting and to press a backlighting-correction button to set a backlighting correction while looking at a small electronic viewfinder EVF. As a consequence, it is possible to realize an easy-to-operate video camera in which photographic errors do not readily occur while maintaining a wide tone representation.

By performing false color signal suppression processing at a plurality of points, unnatural false colors surrounding the main subject at the time of backlighted photography are eliminated and a whiter, more brilliant image is obtained.

With regard to compressing a wide range of tones, portions of minimum and maximum luminance in one picture are grasped by frame division and controlled, thereby constructing a stabilized system. More specifically, in a case where the range of tones changes in one picture, such as when a person in a room and scenery from a window are photographed simultaneously and a light is turned on in the room, the contrast ratio narrows and $t_2$ is changed to alter the compression ratio, whereupon there is a fluctuation in the appearance of the scenery, which actually has not changed. In accordance with the embodiment of the invention, however, the system of area B is dealt with by correcting the iris. As a result, the change in $t_2$ is suppressed so that it is possible to realize a system in which an unnatural change is minimized.

Since it is possible to set depth of field freely, the tones of the background can be expressed and an automatic exposure adjusting function can be exploited to make possible a video representation over a wide range.

The present invention is not limited to the foregoing embodiment and can be modified in various ways without departing from the scope of the claims.

For example, as shown in FIG. 11, a method has been described in which the potential of $V_{sub}$ is changed over between two levels, namely LEVEL 1 and LEVEL 2, in the foregoing embodiment. However, as illustrated in FIG. 29(a), an arrangement may be adopted in which the potential of $V_{sub}$ and the changeover time are divided finely into steps so that the changeover is made stepwise in one picture. Furthermore, a sweep-like operation as shown in FIG. 29(b) can be adopted, in which the potential of $V_{sub}$ and the changeover time are varied continuously.

The present invention is not limited to the above embodiments and various changes and modifications can be made within the spirit and scope of the present invention. Therefore, to apprise the public of the scope of the present invention, the following claims are made.

What is claimed is:

1. An image sensing apparatus comprising:
   sensing means for receiving a light signal, performing a photoelectric conversion on said light signal, and storing information corresponding to the converted light signal; and
   control means for changing a saturation level of an electric charge in said sensing means;
   said control means changing the saturation level of the electric charge during a unit light-storage interval that is for forming one picture.

2. The apparatus according to claim 1, wherein the saturation level of the electric charge is changed from a lower level to a higher level during said interval.

3. An image sensing apparatus comprising:
   sensing means for receiving a light signal, performing a photoelectric conversion on said light signal, and storing information corresponding to the converted light signal; and
   control means for changing a saturation level of an electric charge in said sensing means;
   wherein, during a unit light-storage interval that is for forming one picture, said control means changes the saturation level of the electric charge in a plurality of steps and sets, in dependence upon image information, the timing at which the saturation level of the electric charge is changed in said plurality of steps.

4. The apparatus according to claim 3, wherein the saturation level of the electric charge is changed from a lower level to a higher level during said interval.

5. An image sensing apparatus comprising:
   sensing means for receiving a light signal, and storing information corresponding to the converted light signal; and
   control means for changing a saturation level of an electric charge in said sensing means;
   wherein, during a unit light-storage interval that is for forming one picture, said control means changes the saturation level of the electric charge in a plurality of steps and sets, in dependence upon image information, the levels of said plurality of steps.

6. The apparatus according to claim 5, wherein the saturation level of the electric charge is changed from a lower level to a higher level during said interval.

7. An image sensing apparatus comprising:
   sensing means for receiving a light signal, performing a photoelectric conversion on said light signal, and storing information corresponding to the converted light signal; and
   control means for changing a saturation level of an electric charge in said sensing means;
   wherein, during a unit light-storage interval that is for forming one picture, said control means changes the saturation level of the electric charge, a gain of a color signal being changed in association with the change in the saturation level of the electric charge.

8. The apparatus according to claim 7, wherein the saturation level of the electric charge is changed from a lower level to a higher level during said interval.

9. An image sensing apparatus comprising:
   sensing means for receiving a light signal, performing a photoelectric conversion on said light signal, and storing information corresponding to the converted light signal; and
   control means for changing a saturation level of an electric charge in said sensing means;
   wherein, during a unit light-storage interval that is for forming one picture, said control means changes the saturation level of the electric charge in a plurality of steps and sets, for each of said plurality of steps and on the basis of image information indicative of individual areas in the one picture, the levels of said plurality of steps as well as the timing at which the saturation level of the electric charge is changed in said plurality of steps.

10. The apparatus according to claim 9, wherein the saturation level of the electric charge is changed from a lower level to a higher level during said interval.

11. An image sensing apparatus comprising:
    sensing means for receiving a light signal, performing a photoelectric conversion on the light signal, and storing information corresponding to the converted light signal; and
    control means for changing a saturation level of an electric charge in said sensing means;
    wherein, during a unit light-storage interval that is for forming one picture, said control means changes the saturation level of the electric charge in a plurality of steps and perform storage of the electrical charge in a plurality of steps and perform storage of the electrical charge for prescribed times in distributed fashion in said plurality of steps, thereby controlling substantial exposure time in said plurality of steps.

12. The apparatus according to claim 11, wherein the saturation level of the electric charge is changed from a lower level to a higher level during said interval.

* * * * *

UNITED STATES PATENT AND TRADEMARK OFFICE
CERTIFICATE OF CORRECTION

PATENT NO. : 5,295,001
DATED : March 15, 1994
INVENTOR(S) : KOJI TAKAHASHI

It is certified that error appears in the above-indentified patent and that said Letters Patent is hereby corrected as shown below:

COLUMN 1

Line 20, "appears" should read --appear--.
Line 68, "function In" should read --function. In--.

COLUMN 3

Line 14, "an" should read --and--.

COLUMN 6

Line 25, "FIG." should read --FIGS.--.
Line 42, "An" should read --A--.

COLUMN 10

Line 1, "LEVE1" should read --LEVEL--.

UNITED STATES PATENT AND TRADEMARK OFFICE
CERTIFICATE OF CORRECTION

PATENT NO. : 5,295,001

DATED : March 15, 1994

INVENTOR(S) : KOJI TAKAHASHI

It is certified that error appears in the above-indentified patent and that said Letters Patent is hereby corrected as shown below:

COLUMN 12

Line 56, "strength" should read --strengthen--.

COLUMN 13

Line 32, "complimentary" should read --complementary--.
Line 35, "②" " should read --②'--.

COLUMN 14

Line 4, "FIG." should read --FIGS.--
Line 20, "34))" should read --34)--.
Line 51, "know" should read --known--.

UNITED STATES PATENT AND TRADEMARK OFFICE
CERTIFICATE OF CORRECTION

PATENT NO. : 5,295,001

DATED : March 15, 1994

INVENTOR(S) : KOJI TAKAHASHI

It is certified that error appears in the above-indentified patent and that said Letters Patent is hereby corrected as shown below:

COLUMN 18

Line 1, "signal, and" should read --signal, performing a photoelectric conversion on said light signal, and--.
Line 5, "said" should read --the--.
Line 20, "in said" should read --storable in the--.
Line 59, "perform" should read --performs--.
Line 60, "in a plurality of steps and perform storage" should be deleted.
Line 61, "of the electrical charge" should be deleted.

Signed and Sealed this

Sixth Day of May, 1997

Attest:

BRUCE LEHMAN

Attesting Officer

Commissioner of Patents and Trademarks